US008933623B2

(12) United States Patent
Hanamura et al.

(10) Patent No.: US 8,933,623 B2
(45) Date of Patent: Jan. 13, 2015

(54) ORGANIC EL DEVICE, METHOD OF PRODUCING ORGANIC EL DEVICE, AND ELECTRONIC APPARATUS

(75) Inventors: Yuki Hanamura, Shiojiri (JP); Shinichi Iwata, Chino (JP); Masanori Iwasaki, Shiojiri (JP); Daisuke Nishioka, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 147 days.

(21) Appl. No.: 13/198,089

(22) Filed: Aug. 4, 2011

(65) Prior Publication Data

US 2012/0038267 A1 Feb. 16, 2012

(30) Foreign Application Priority Data

Aug. 11, 2010 (JP) ................................. 2010-180103

(51) Int. Cl.
*H01L 51/52* (2006.01)
*H01L 27/32* (2006.01)
(52) U.S. Cl.
CPC ........... *H01L 27/322* (2013.01); *H01L 51/5284* (2013.01)
USPC ............................ 313/504; 313/505; 313/506
(58) Field of Classification Search
CPC .............. H01L 27/322; H01L 27/3244; H01L 27/3211; H01L 29/78633; H01L 27/3295; H01L 27/3283; H01L 27/14621; H01L 27/3206; H01L 2251/5361; H01L 31/02164; G02F 1/133514; G02F 1/133512; G02F 1/136209; G02F 2001/136222
USPC .................. 313/498–512; 428/690–691, 917; 438/26–29, 34, 82; 427/66, 532–535, 427/539
See application file for complete search history.

(56) References Cited

U.S. PATENT DOCUMENTS

| 5,589,732 | A | * | 12/1996 | Okibayashi et al. | .......... 313/506 |
| 6,004,681 | A | * | 12/1999 | Epstein et al. | ................. 428/457 |
| 7,456,570 | B2 | * | 11/2008 | Kawamura et al. | ........... 313/512 |
| 7,708,614 | B2 | * | 5/2010 | Harada | ............................ 445/25 |
| 7,965,034 | B2 | * | 6/2011 | Chae et al. | ..................... 313/506 |
| 8,044,575 | B2 | * | 10/2011 | Kawamura | ..................... 313/504 |
| 2003/0107314 | A1 | * | 6/2003 | Urabe et al. | ................... 313/506 |
| 2006/0214579 | A1 | * | 9/2006 | Iwase et al. | .................... 313/512 |
| 2006/0220550 | A1 | * | 10/2006 | Harada | ........................... 313/512 |
| 2007/0007870 | A1 | * | 1/2007 | Yamazaki et al. | ............. 313/112 |
| 2007/0123135 | A1 | | 5/2007 | Yang et al. | |

(Continued)

FOREIGN PATENT DOCUMENTS

JP A-2006-339028 12/2006
JP A-2007-149693 6/2007

(Continued)

*Primary Examiner* — Anh Mai
*Assistant Examiner* — Fatima Farokhrooz
(74) *Attorney, Agent, or Firm* — Oliff PLC

(57) ABSTRACT

An organic EL device includes a substrate, an organic EL element that is formed on the substrate and is provided with a first electrode, a light emitting functional layer, and a second electrode having transparent conductivity to emit light to the second electrode side, a color filter that is formed on the second electrode side in a pixel area where the organic EL element emits the light, and a partition that is formed in a light shielding area that is an area other than the pixel area. The color filter is provided with any one of a red color filter, a green color filter, and a blue color filter. At least one color filter of the three color filters constitutes at least a part of the partition.

20 Claims, 16 Drawing Sheets

(56) References Cited

U.S. PATENT DOCUMENTS

2009/0153036 A1* 6/2009 Gonda .................... 313/504
2010/0117528 A1* 5/2010 Fukuda .................. 313/505
2012/0299471 A1* 11/2012 Yamazaki et al. ........ 313/504

FOREIGN PATENT DOCUMENTS

| | | |
|---|---|---|
| JP | A-2008-091069 | 4/2008 |
| JP | A-2010-027265 | 2/2010 |

* cited by examiner

ORGANIC EL DEVICE, METHOD OF PRODUCING ORGANIC EL DEVICE, AND ELECTRONIC APPARATUS

BACKGROUND

1. Technical Field

The present invention relates to an organic EL device, a method of producing the organic EL device, and an electronic apparatus.

2. Related Art

Recently, as a flat display device, attention has been paid to an organic EL device in which organic EL elements formed by laminating an anode (first electrode), a light emitting functional layer including at least an organic EL (electroluminescent) layer, and a cathode (second electrode) are regularly arranged in an image display area. Fields requiring miniaturization such as a display screen for a mobile phone, a head mount display (HMD), and an electronic viewfinder (EVF) have been developed as fields of use for the organic EL device. In the small-size organic EL device, to reduce matching deviation between the organic EL element and a color filter, employing an on-chip color filter in which the color filter is formed on a substrate on which the organic EL element is formed can be considered.

When the color filter is formed on the substrate on which the organic EL element is formed, a configuration is presented in which a black matrix formed of metal is used as a partition (e.g., JP-A-2010-027265). That is, a metal thin film such as Cr (chromium) and Al (aluminum) is subjected to patterning to form a partition having a net shape (lattice shape) in the plan view, to reduce a phenomenon where light from one organic EL element is emitted from the light emitting area of another, adjacent organic EL element.

However, in the production process of the above-described organic EL device, a process of forming a metal thin film and a patterning process are additionally necessary, and there is a problem that production costs increases. In addition, there is a problem of concern over influence on an organic EL element with low heat resistance.

SUMMARY

An advantage of some aspects of the invention is to solve at least a part of the problems.

According to an aspect of the invention, there is provided an organic EL device including: a substrate; an organic EL element that is formed on the substrate and is provided with a first electrode, a light emitting functional layer, and a second electrode having transparent conductivity to emit light to the second electrode side; a color filter that is formed on the second electrode side in a pixel area where the organic EL element emits the light; and a partition that is formed in a light shielding area that is an area other than the pixel area, wherein the color filter is provided with any one of three color filters of a red color filter that allows red light to pass, a green color filter that allows green light to pass, and a blue color filter that allows blue light to pass, and wherein at least one color filter of the three color filters constitutes at least a part of the partition.

With such a configuration, it is possible to reduce the thin film forming process and the patterning process, as compared with a case of separately forming a partition using a light shielding material, such as metal. Accordingly, it is possible to improve the reliability of the organic EL device. In addition, it is possible to reduce production costs.

In the organic EL device, it is preferable that at least the substrate side of the partition be formed of the red color filter.

The red color filter has a high light shielding property against two primary colors, that is, green light and blue light except for red light. With such a configuration, it is possible to sufficiently reduce the light emitted from the light shielding area, and it is possible to improve display quality.

In the organic EL device, it is preferable that at least the substrate side of the partition adjacent to the pixel area in the plan view be formed of the color filter formed in each pixel area.

With such a configuration, it is not necessary to form a color filter, which is a different color from that of the color filter formed at both pixel areas, between adjacent pixel areas. Accordingly, it is possible to configure the partition without performing a delicate patterning process, thereby further reducing the production cost.

In the organic EL device, it is preferable that the light emitting functional layer be a light emitting functional layer that emits white light, the second electrode is formed of a semi-transmissive and reflective material, a reflective layer is formed between the substrate and the light emitting functional layer, and an optical resonant structure is formed between the second electrode and the reflective layer.

With such a configuration, it is possible to emit light with further improved color purity using the color filter after light in a specific wavelength range is accentuated by the optical resonant structure. Accordingly, it is possible to omit a patterning process of the light emitting functional layer and it is possible to further reduce the production cost.

In the organic EL device, it is preferable that a protective layer including an inorganic material layer be formed between the organic EL element and the color filter.

Since the inorganic material layer has a high sealing property, with such a configuration, it is possible to protect the organic EL element after the process of producing the color filter and the completion of the organic EL device. Accordingly, it is possible to improve reliability of the organic EL device.

In the organic EL device, it is preferable that the protective layer be a layer including a planarization layer formed of an organic material formed on the organic EL element side and an inorganic material layer formed on the color filter side.

With such a configuration, it is possible to remove a level difference caused by the forming of the optical resonant structure in the planarization layer while securing the sealing property by the inorganic material layer. Accordingly, it is possible to improve display quality while maintaining the reliability of the organic EL device.

According to another aspect of the invention, there is provided an electronic apparatus including the organic EL device.

With such a configuration, it is possible to obtain the electronic apparatus including a display unit with improved display quality and reliability at a low cost.

According to still another aspect of the invention, there is provided a method of producing an organic EL device including: sequentially laminating an island-shaped first electrode, a light emitting functional layer, and a second electrode formed of a transparent conductive material to form an organic EL element in an image display area on a substrate; partitioning the image display area into a pixel area included in the first electrode in the plan view and a light shielding area that is an area other than the pixel area, and partitioning the pixel area into three kinds of pixel areas of a red pixel area, a green pixel area, and a blue pixel area; forming a red coloring layer in the red pixel area and the light shielding area; and forming a green coloring layer in the green pixel area, and forming a blue coloring layer in the blue pixel area.

With such a production method, it is possible to form the partition between the pixel areas adjacent to each other without performing the forming and the patterning of the light shielding material layer. Accordingly, it is possible to obtain the organic EL device capable of color display while reducing the influence on the organic EL element and the production cost.

In the method of producing the organic EL device, it is preferable that in the forming of the green coloring layer and the blue coloring layer, the green coloring layer be formed in the green pixel area and a ring-shaped area surrounding the green pixel area, and the blue coloring layer be formed in the blue pixel area and a ring-shaped area surrounding the blue pixel area.

With such a production method, it is possible to form the partition formed of a 2-layer transparent coloring layer including the red coloring layer in the light shielding area around the green pixel area and the light shielding area around the blue pixel area. Accordingly, it is possible to obtain the organic EL device with further improved display quality.

According to still another aspect of the invention, there is provided a method of producing an organic EL device including: sequentially laminating an island-shaped first electrode, a light emitting functional layer, and a second electrode formed of a transparent conductive material to form an organic EL element in an image display area on a substrate; partitioning the image display area into a pixel area included in the first electrode in the plan view and a light shielding area that is an area other than the pixel area, and partitioning the pixel area into three kinds of pixel areas of a red pixel area, a green pixel area, and a blue pixel area; forming a red coloring layer in an area adjacent to the red pixel area between the red pixel area and the light shielding area; forming a green coloring layer in an area adjacent to the green pixel area between the green pixel area and the light shielding area; and forming a blue coloring layer in an area adjacent to the blue pixel area between the blue pixel area and the light shielding area.

With such a production method, it is possible to form the partition between the pixel areas adjacent to each other without performing the forming and the patterning of the light shielding material layer. Accordingly, it is possible to obtain the organic EL device capable of color display while reducing the influence on the organic EL element and the production cost.

In the method of producing the organic EL device, it is preferable that in the forming of the red coloring layer, the red coloring layer be formed in the area adjacent to the red pixel area between the red pixel area and the light shielding area, and in an area where the green coloring layer is not formed in the forming of the green coloring layer and the blue coloring layer is not formed in the forming of the blue coloring layer.

With such a production method, it is possible to form at least a further transparent coloring layer throughout the light shielding area. Accordingly, it is possible to reduce the emission of the light in the light shielding area, and it is possible to obtain the organic EL device with further improved display quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a method of producing an organic EL device according to embodiments of the invention will be described with reference to the drawings. In the following drawings, the reduced scales of layers and portions are different from the actual sizes such that the layers and the portions can be recognized on the drawings.

First Embodiment

Figure 1:
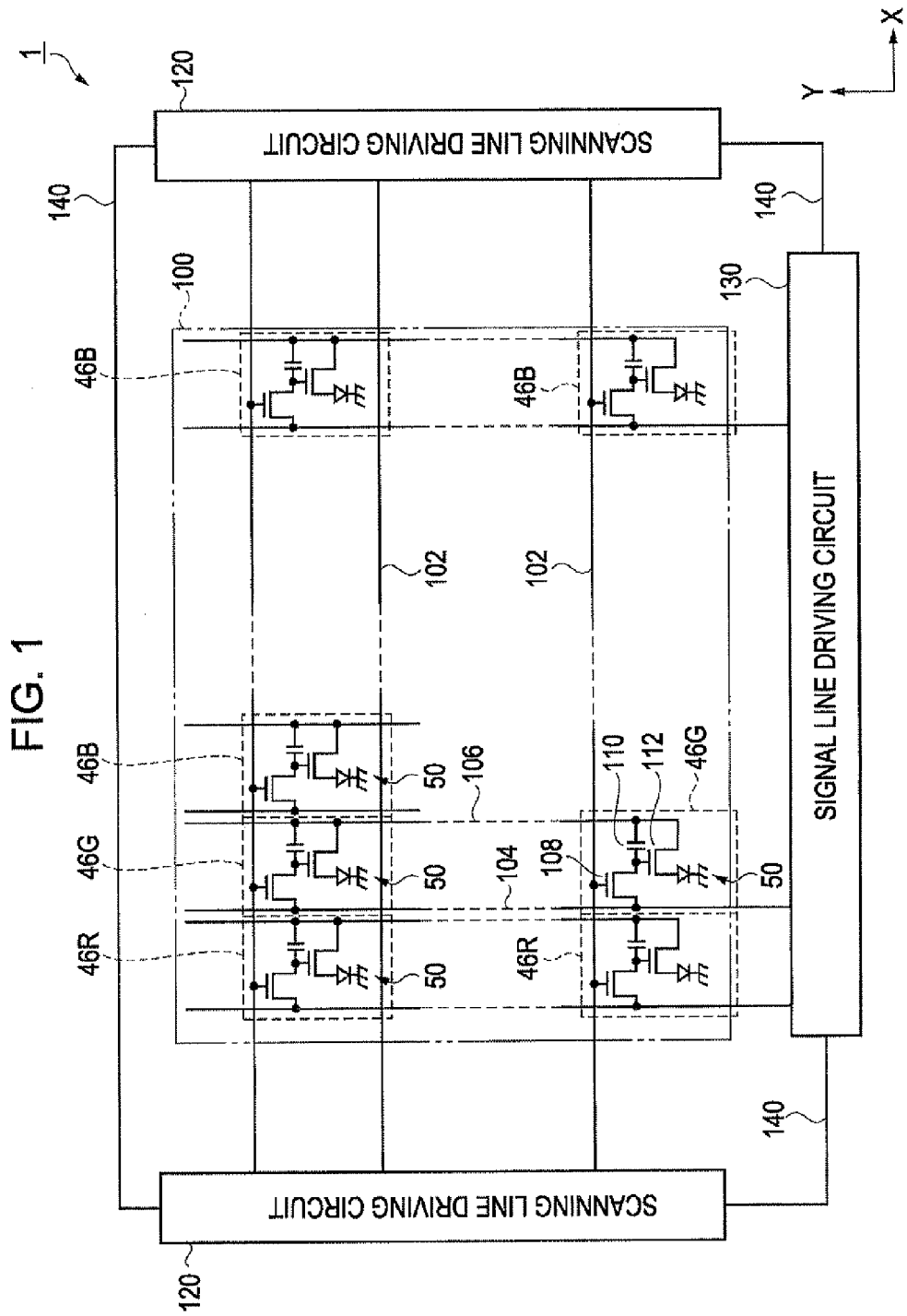
FIG. 1 is a diagram illustrating a circuit configuration of an organic EL device according to a first embodiment.

FIG. 1 is a diagram illustrating a circuit configuration of an organic EL device 1 according to the embodiment. A circuit configuration of organic EL devices according to embodiments to be described later is the same as the configuration shown in FIG. 1. The organic EL device 1 is an active matrix type organic EL device which individually controls emitting light of a plurality of regularly formed organic EL elements 50 to form a color image in an image display area 100. In the image display area 100, a plurality of scanning lines 102 extending in the X direction, a plurality of signal lines 104 extending in the Y direction to perpendicularly intersect with the scanning lines, and a plurality of power supply lines 106 extending in parallel to the signal lines are formed. A pixel 46 is formed in each section surrounded with three kinds of lines.

Each pixel 46 is provided with a switching TFT (thin film transistor) 108 in which a scanning signal is supplied to a gate electrode through the scanning line 102, a storage capacitor 110 storing the image signal supplied from the signal line 104 through the switching TFT 108, a driving TFT 112 in which the image signal stored by the storage capacitor 110 is supplied to a gate electrode, and an organic EL element 50 in which a driving current is supplied from the power supply line 106 through the driving TFT 112. The TFTs are formed using a so-called high temperature polysilicon process. Each organic EL element 50 is formed of a pixel electrode (anode) 52 (see FIG. 5) as a first electrode, a cathode 56 (see FIG. 5) as a second electrode formed in the whole area of the image display area 100, and a light emitting functional layer 54 (see FIG. 3) including at least an organic EL layer similarly formed in the whole area of the image display area 100.

As the pixels 46, there are a total of 3 kinds of a red pixel 46R emitting red light, a green pixel 46G emitting green light, and a blue pixel 46B generating blue light, which are regularly formed in the image display area 100. Specifically, the pixels 46 generating the same color are arranged in the Y direction, and three kinds of pixels 46 (R, G, and B) are regularly formed in the X direction. The pixel 46 is a functional concept configured by the constituent elements. A pixel area 42 (see FIG. 2 and the like) to be described later is a planar concept representing the minimum unit area where any of the three primary colors of red, green, and blue light can be emitted.

A scanning line driving circuit 120 and a signal line driving circuit 130 are formed around the image display area 100. Scanning signals are sequentially supplied from the scanning line driving circuit 120 to the scanning lines 102 according to various signals supplied from an external circuit (not shown). Image signals are supplied from the signal line driving circuit 130 to the signal lines 104, and pixel driving current is supplied from an external circuit (not shown) to the power supply lines 106. An operation of the scanning line driving circuit 120 and an operation of the signal line driving circuit 130 are synchronized with each other by a synchronization signal supplied from an external circuit through a synchronization signal line 140.

When the scanning line 102 is driven and the switching TFT 108 is turned on, a potential of the signal line 104 at that time point is stored in the storage capacitor 110, and a level of the driving TFT 112 is determined according to the state of the storage capacitor 110. The driving current flows from the power supply line 106 to the pixel electrode 52 through the driving TFT 112, and the driving current flows to the cathode 56 through the light emitting functional layer 54. The light emitting functional layer 54 emits light according to the magnitude of the driving current. As a result, each organic EL element 50 provided with the light emitting functional layer and each pixel 46 provided with the organic EL element emit light according to the magnitude of the driving current. As a result, a color image is formed in the image display area 100 in which three kinds of pixels 46 (R, G, and B) are regularly formed.

A color (any of the three primary colors) of the emitted light of each pixel 46 is generated by a color filter 90 (see FIG. 3 and the like) allowing light in a predetermined wavelength range to pass and blocking light in other wavelength ranges, to be described later.

Accordingly, the individual organic EL elements 50 are common among three kinds of pixels 46 (R, G, and B). In the following description, when merely "pixel 46" is mentioned, it is the collective term for the above-described three kinds of pixels 46 (R, G, and B).

In the description of the embodiment and embodiments to be described later, reference signs R, G, and B are given to the color filters 90 (see FIG. 3), the pixel areas 42 (see FIG. 2), the pixel electrodes 52 (see FIG. 2), and the like, which are constituent elements of the pixels 46, according to three kinds of pixels 46 (R, G, and B). When merely "color filter 90" is mentioned without the reference signs (R, G, and B), it is a collective term like "pixel 46".

Since the pixels 46 can generate light (any light of the three primary colors of light) with arbitrary intensity in a predetermined range, combination of three pixels 46 arranged in the X direction can generate light of an arbitrary color (chromaticity). The combination of three pixels 46 may be defined as "pixels" and the individual pixels 46 may be defined as "sub-pixels", but in the specification, the minimum unit capable of generating light with any of the three primary colors of light is defined as "pixel 46".

Figure 2:
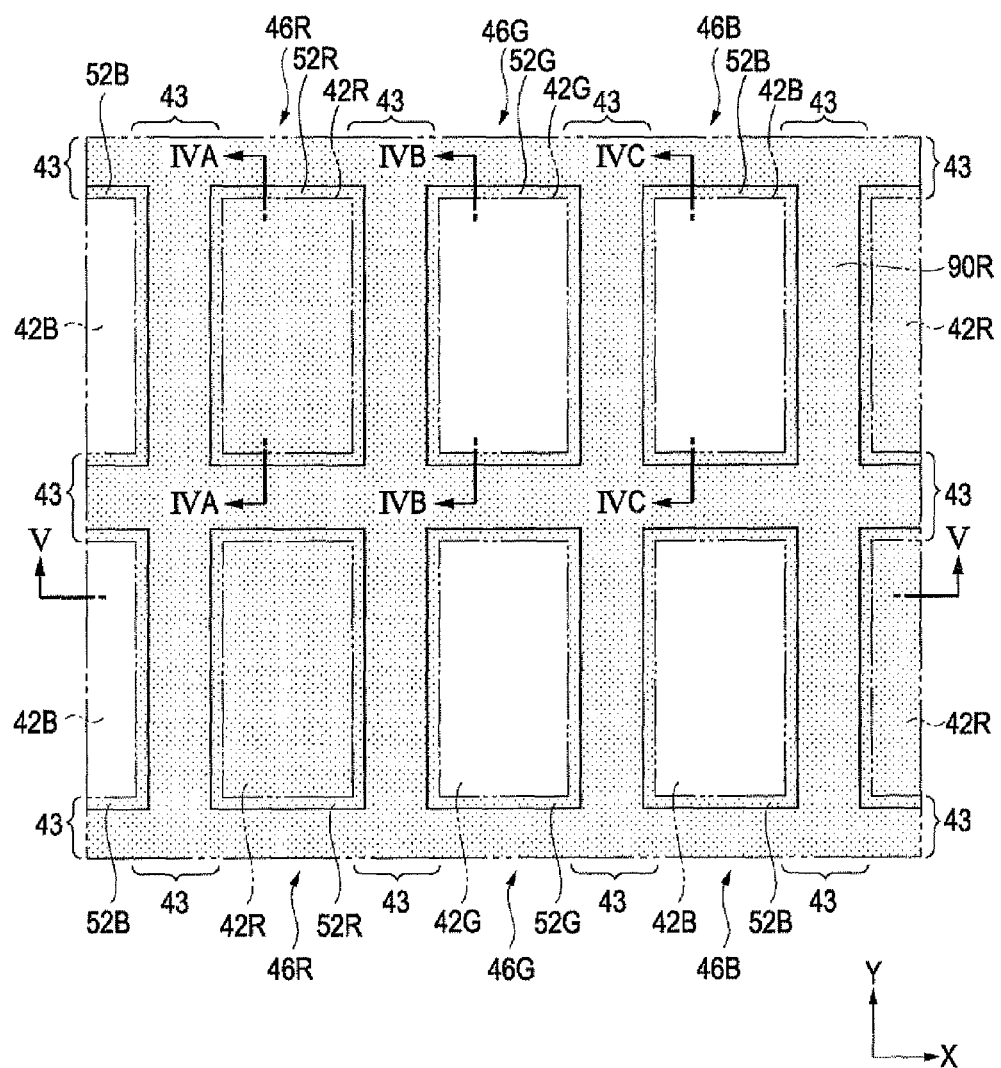
FIG. 2 is a schematic plan view illustrating arrangement of pixel electrodes and the like in an image display area of the organic EL device.
Figure 3:
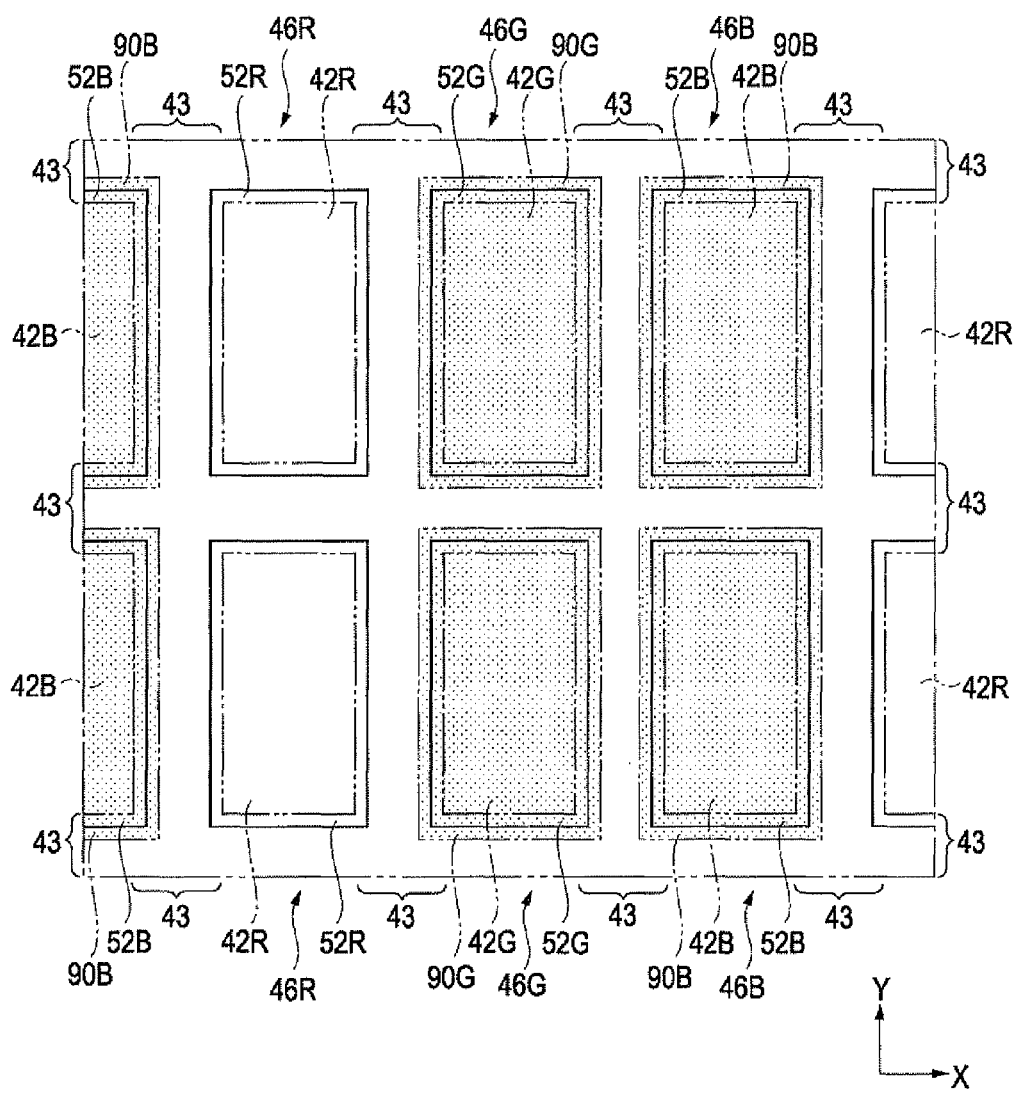
FIG. 3 is a schematic plan view illustrating arrangement of pixel electrodes and the like in an image display area of the organic EL device.
Figure 4:
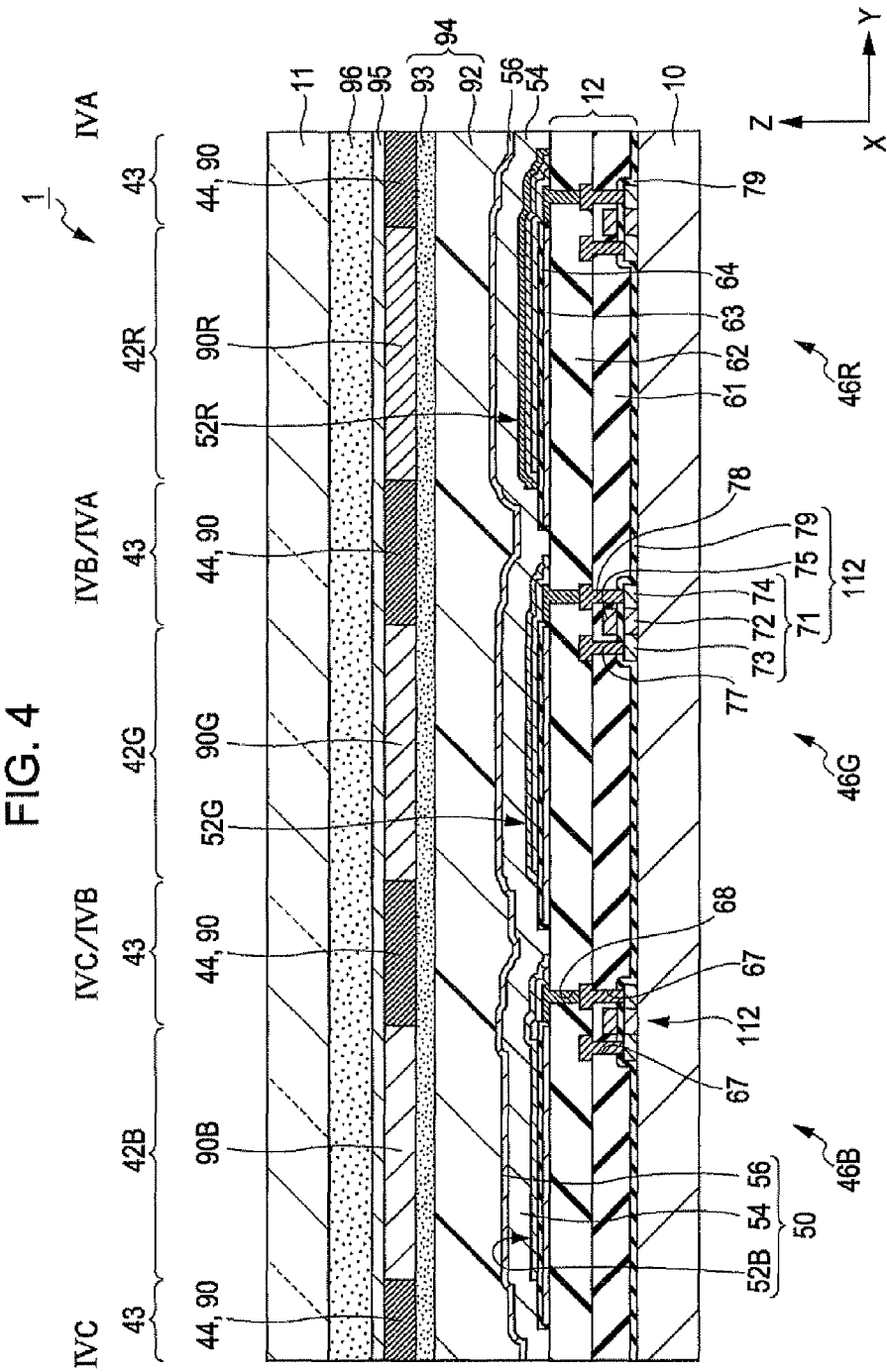
FIG. 4 is a schematic cross-sectional view illustrating a cross section in a Y direction of the organic EL device according to the first embodiment.
Figure 5:
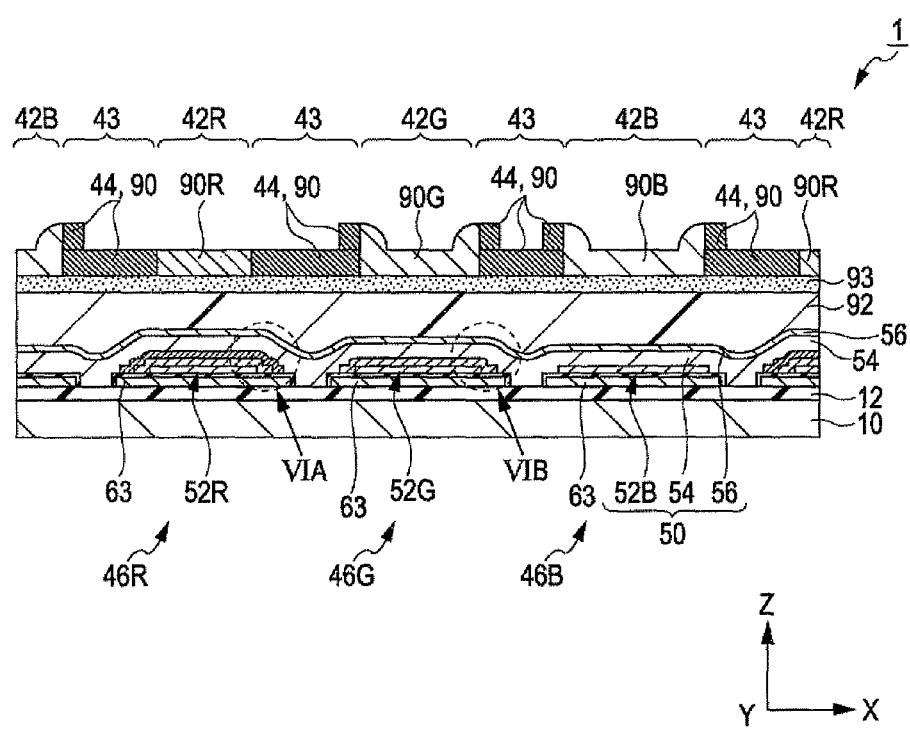
FIG. 5 is a schematic cross-sectional view illustrating a cross section in an X direction of the organic EL device according to the first embodiment.

FIG. 2 to FIG. 7 are diagrams illustrating the configuration and the like of the organic EL device 1 according to the embodiment. FIG. 2 is a schematic plan view illustrating the enlarged inside of the image display area 100 of the organic EL device 1. FIG. 4 is a schematic cross-sectional view illustrating a cross section in the Y direction shown in FIG. 2. FIG. 5 is a schematic cross-sectional view illustrating a cross section in the X direction shown in FIG. 2. FIG. 3, FIG. 6A, FIG. 6B, and FIG. 7 will be described later. Hereinafter, the configuration and the like of the organic EL device 1 will be described with reference to FIG. 2 to FIG. 7.

FIG. 2 is a schematic plan view illustrating arrangement of the pixel electrodes 52 and the like in the image display area 100 (see FIG. 1) of the organic EL device 1, and a formation area (forming area) of the red color filter 90R. FIG. 3 is a schematic plan view illustrating arrangement of the pixel electrodes 52 and the like in the image display area 100 of the organic EL device 1, and a formation area of the green color filter 90G and a formation area of the blue color filter 90B. In the organic EL device 1 and organic EL devices of embodiments to be described later, at least a single-layer color filter 90 is formed on the entire face of the image display area 100 including a light shielding area 43 to be described later.

As shown in FIG. 2 and FIG. 3, the rectangular pixel areas 52 in the plan view are regularly formed in the image display area 100. In the pixel electrodes 52, the pixel area 42 is partitioned to be included in the pixel electrodes in the plan view. Specifically, in the plan view, an area except for a ring-shaped area having some width occupying an outer frame portion of the pixel electrode from the pixel electrode 52 is the pixel area 42. As described above, the pixels 46 (R, G, and B) have a one to one correspondence to the pixel electrodes 52 (R, G, and B), respectively.

An area which is not included in the pixel area 42 in the image display area 100, that is, an area separating the pixel areas 42 adjacent to each other, is a light shielding area 43. As described above, the pixel area 42 is an area included in the electrode 52. Accordingly, the outer frame portion of the pixel electrode 52, that is, the above-described ring-shaped area, is included in the light shielding area 43. In the organic EL device 1, the pixel electrodes 52 are formed in a matrix, and thus the light shielding area 43 has a lattice shape. The arrangement of the pixel electrodes 52 is not limited to the matrix shape, and may be arranged in other shapes, for example, in zigzags.

The size of each pixel area 42 is about 14 μm×about 4 μm. The width of the light shielding area 43 separating the pixel areas 42 adjacent to each other is about 1 μm. Accordingly, the pixel areas 42 are formed to be about 15 μm×about 5 μm in terms of the measurement between centers. As described above, in the organic EL device 1 of the embodiment, a semiconductor layer 71 (see FIG. 4) constituting the driving TFT 112 and the like driving the individual organic EL elements 50 is formed in a high temperature polysilicon process. Accordingly, the elements such as the driving TFT 112 are miniaturized and become smaller in area. For this reason, in the small-faced pixel area 42 of about 14 μm×about 4 μm as described above, the switching TFT 108, the storage capacitor 110, and the driving TFT 112 constituting one pixel 46 can be formed.

The pixel area 42 is an area where the light generated in the organic EL element 50 is emitted. After the emitted light is set as light corresponding to any of the three primary colors using a color filter 90 and an optical resonant structure to be described later, the light is emitted. As described above, in the organic EL device 1 of the embodiment and organic EL devices (hereinafter, referred to as "organic EL device 1 and the like") of embodiments to be described later, the light emitting functional layer 54 and the cathode 56 are formed on the entire face of the image display area 100. Accordingly, the formation area of the pixel electrode 52 and the area where the generated light is emitted coincide with each other.

However, as described above, in the organic EL device 1 and the like, light of the three primary colors is obtained using both of the optical resonant structure and the color filter 90. The layer thickness of the pixel electrode 52 is non-uniform at the outer frame portion of the pixel electrode 52, and thus the resonance length is changed. That is, it is difficult to form the optical resonant structure appropriately. As a result, in the outer frame portion, light in which a wavelength distribution deviates from a wavelength distribution of light of the three primary colors may occur. For this reason, in the organic EL device 1 and the like, an area except for the outer frame portion from the pixel electrode 52 in the plan view is defined as the pixel area 42, and the outer frame portion is included in the light shielding area 43.

The hatched area in FIG. 2 is the formation area of the red color filter 90R. The hatched area in FIG. 3 is the formation area of the green color filter 90G and the formation area of the blue color filter 90B. Hereinafter, a material forming the color filter will be described. The color filter 90 of the organic EL device 1 and the like is formed by patterning a resin, such as negative type acryl, in which a pigment or the like is dispersed, that is, a transparent coloring layer.

In the color filters 90, pigments according to light emitting colors of the pixels 46 are mixed. In the red color filter 90R, a material allowing light in a wavelength range corresponding to red light, that is, light in the range of about 610 nm to about 750 nm to pass, and absorbing light in other wavelength ranges, is dispersed. In the green color filter 90G, a material allowing light in a wavelength range corresponding to green light, that is, light in the range of about 500 nm to about 560 nm to pass, and absorbing light in other wavelength ranges, is dispersed. In the blue color filter 90B, a material allowing light in a wavelength range corresponding to blue light, that is, light in the range of about 435 nm to about 480 nm to pass, and absorbing light in other wavelength ranges, is dispersed.

As shown in FIG. 2, the red color filter 90R is formed in the whole area except for the green pixel area 42G and the blue pixel area 42B. That is, the red color filter 90R is formed in the whole area of the light shielding area 43 and the red pixel area 42R. As shown in FIG. 3, the green color filter 90G and the blue color filter 90B are formed locally as compared with the red color filter 90R. Specifically, the color filters 90G and 90B are formed to overlap the pixel electrodes 52 (G and B) with a ring-shaped area (area represented by a two-dot chain line on the outside) with a predetermined width surrounding the pixel electrodes in the plan view. Accordingly, the green color filter 90G and the blue color filter 90B are formed on the corresponding pixel areas 42 (B and G) and in an area adjacent to the pixel areas 42 (B and G) of the light shielding area 43, that is, only in the ring-shaped area surrounding the pixel area.

In the organic EL device 1 and the like, the color filter 90 also serves as the partition 44 (see FIG. 5 and the like). That is, in the organic EL device 1 and the like, the partition 44 is formed of the color filter 90. As described previously, the partition 44 is an element formed to reduce the emission of light generated by the organic EL element 50 from areas except for the pixel area 42. Among the color filters 90 formed in the whole area of the image display area 100, an area formed in an area which does not overlap with the pixel area 42, that is, a part formed in the light shielding area 43, becomes the partition 44. Accordingly, among the color filters 90, a part formed in the pixel area 42 serves as a narrowly-defined (that is, original) color filter 90. As described above, the color filter 90 is the transparent coloring layer. Among the transparent coloring layers formed in the whole area of the image display area 100, a part overlapping with the pixel area 42 may be defined as the color filter 90, and a part overlapping with the light shielding area 43 may be defined as the partition 44.

In the specification, in the plan view, the reference numeral "44" is not used, and the reference numeral "90" is used in all cases. In the cross-sectional view, among the broadly-defined color filters, reference numeral "44 (90)" is given to a part serving as the partition formed in the light shielding area 43. In the description of the specification, "partition 44" is described.

As shown in FIG. 2, the red color filter 90R is formed in the entire area of the red pixel area 42R and the light shielding area 43. That is, the red color filter 90R is formed up to a part reaching the outer peripheral line of the green pixel area 42G and the blue pixel area 42B. In the organic EL device 1, the red color filter 90R is formed earlier than the other color filters 90 (G and B). Accordingly, in the ring-shaped area surrounding the green pixel area 42G, a laminated body in which the lower layer (the element substrate 10 side) is the red color filter 90R and the upper layer is the green color filter 90G is formed. Similarly, in the ring-shaped area surrounding the blue pixel area 42B, a laminated body in which the lower layer (the element substrate 10 side) is the red color filter 90R and the upper layer is the blue color filter 90B is formed. Meanwhile, in the ring-shaped area surrounding the red pixel area 42R, only the red color filter 90R is formed.

In the organic EL device 1 and the like according to embodiments of the invention, the partition 44 is formed of the color filter 90. Accordingly, emission of generated light from the area except for the pixel area 42 is reduced without separately forming transparent resin in which a black pigment is dispersion-equalized, or a black matrix formed of a metal material such as Al. For this reason, a photolithography process, that is, a film forming process, and a patterning process, that is, a wet etching process are reduced by at least one process. As a result, burden on the organic EL element 50 with low corrosion resistance and heat resistance is reduced, and reliability of the organic EL device is improved.

In the organic EL device 1 according to the embodiment, the red color filter 90R is formed in the whole area of the light shielding area 43, and thus display quality is also improved, corresponding to fluctuations in the resonance length in the outer frame portion of the pixel area 52.

FIG. 4 is a schematic cross-sectional view illustrating the cross section in the Y direction of the organic EL device 1.

Specifically, FIG. 4 is a view illustrating a junction of the cross section taken along the line IVA-IVA, the cross section taken along the line IVB-IVB, and the cross section taken along the line IVC-IVC of FIG. 2, and is a view illustrating a junction of the cross section of three kinds of pixels 46 (R, G, and B) which can be arranged in the X direction. In the drawing, the switching TFT 108 and the storage capacitor 110 are not shown. Hereinafter, description is performed in order from the element substrate 10 side.

The element substrate 10 is formed of quartz glass. The organic EL device 1 and the like are top emission type organic EL devices emitting light to the opposite side to the element substrate 10 side. Accordingly, it is not necessary that the element substrate 10 have transparency. However, the element substrate 10 also serves as a substrate when the driving TFT 112 and the like are formed by a high temperature polysilicon process. For this reason, it is necessary to withstand heating of about 1000 degrees, and it is necessary that impurities be not precipitated at the time of heating. To satisfy the conditions, the quartz glass is used in the element substrate 10.

The driving TFT 112 is formed on the face of the element substrate 10 on the opposed substrate 11 side, corresponding to each of three kinds of pixels 46 (R, G, and B). As described above, the switching TFT 108 and the like are not shown. The opposed substrate 11 side is referred to as "surface", "upper side", or "upside" in the following description.

The driving TFT 112 includes a semiconductor layer 71 formed of poly(polycrystalline)silicon, a gate insulating film 79, and a gate electrode 75. The polysilicon that is a constituent material of the semiconductor layer 71 is formed in the high temperature process as described above, and mobility and the like are improved. The gate electrode 75 is formed of Al (aluminum) or the like, and is formed by patterning the same layer as the scanning line 102 described above. The gate insulating film 79 is formed of $SiO_n$ (silicon oxide), $SiN_n$ (silicon nitride), or $SiO_mN_n$ (silicon oxide nitride), and is formed on the entire face of the image display area 100.

The semiconductor layer 71 includes a channel area 72 that is a part opposed to the gate electrode 75, and a source area 73 and a drain area 74 that are both side areas of the channel area. A first interlayer insulating film 61 formed of $SiO_n$ or the like is formed on the surface of the driving TFT 112. A first contact hole 67 is formed in an area of the first interlayer insulating film 61 overlapping with the source area 73 and the drain area 74 described above (by selectively removing the first interlayer insulating film). A source electrode 77 and a drain electrode 78 are formed to be embedded in the first contact hole.

A second interlayer insulating film 62 formed of $SiO_n$ or the like is formed on the surface of the source electrode 77 and the drain electrode 78. A second contact hole 68 is formed on the surface of the drain electrode 78 by selectively removing the second interlayer insulating film. A reflective layer 63 is formed in an area except for the formation area of the second contact hole and some area therearound in the plan view. The reflective layer 63 is formed by patterning a metal material layer with high reflectance such as Al. Each reflective layer 63 is covered with a reflective-layer protective layer 64 formed of an inorganic material such as $SiO_n$. The pixel electrode 52 is formed on the surface of each reflective layer 63 with the reflective-layer protective layer interposed therebetween.

The pixel electrode 52 is formed of a transparent conductive material such as ITO (indium tin oxide), and is connected to the drain electrode 78 through the second contact hole 68. Accordingly, the pixel electrode 52 is electrically connected to the driving TFT 112 to supply driving current supplied from the power supply line 106, to the light emitting functional layer 54 to be described later.

As shown, the layer thickness of the pixel electrode 52 of the organic EL device 1 is different according to a light emitting color of the pixel 46. Specifically, the layer thickness of the red pixel electrode 52R of the red pixel 46R is about 100 nm, the layer thickness of the green pixel electrode 52G of the green pixel 46G is about 60 nm, and the layer thickness of the blue pixel electrode 52B of the blue pixel 46B is about 20 nm. The difference in layer thickness is set to highlight the light with predetermined wavelength distribution using resonance (resonance phenomenon). That is, the sum of the layer thickness of the pixel electrode 52, the layer thickness of the light emitting functional layer 54, and the layer thickness of the reflective-layer protective layer 64 is set to be an appropriate length to highlight the light in the wavelength range to be emitted by the pixels 46.

The pixel electrode 52 is formed by repeating a photolithography process, specifically, a combination of a film forming process and a patterning process of the ITO thin film, a total of three times.

The first photolithography process is a process of forming the ITO thin film with a film thickness of 40 nm on the entire face of the element substrate 10, then leaving the thin film in an area around the second contact hole 68 and an area where the red pixel electrode 52R will be formed, and selectively removing the thin film from the other area.

The second photolithography process is a process of forming the ITO thin film with a film thickness of 40 nm on the entire face of the element substrate 10, then leaving the thin film in an area around the second contact hole 68, an area where the red pixel electrode 52R will be formed, and an area where the green pixel electrode 52G will be formed, and selectively removing the thin film from the other area.

The third photolithography process is a process of forming the ITO thin film with a film thickness of 20 nm on the entire face of the element substrate 10, then leaving the thin film in an area around the second contact hole 68 and an area where any of three kinds of pixel electrodes 52 (R, G, and B) will be formed, and selectively removing the thin film from the other area.

Since the patterning of the ITO thin film is performed by wet etching, the layer thickness of the outer frame portion of the pixel electrode 52 becomes gradually thinner. In the pixel electrodes 52 (R and G) of the red pixel 46R and the green pixel 46G, a level difference occurs due to the end portion of the previously formed ITO thin film, and thus it is difficult to form the above-described resonance length at a very appropriate distance. In the organic EL device 1, the outer frame portion is not included in the pixel area 42, and is included in the light shielding area 43. The partition 44 is formed to overlap with the outer frame portion in the plan view, and thus emission of the light in the wavelength range which is not very appropriate is reduced. As described above, the partition 44 is a part formed in the light shielding area 43 of the color filter 90.

As will be described later, the partition 44 may be formed of a laminated body of the 2-layer color filter 90, but it is shown that all the partitions 44 are formed of the single-layer color filter 90 in this drawing.

The light emitting functional layer 54 and the cathode 56 are formed on the surface of the pixel electrode 52 throughout the whole area of the image display area 100. The organic EL element 50 is formed of the pixel electrode 52, the light emitting functional layer 54, and the cathode 56. In the following description, a part from the surface of the element substrate 10 to the lower face of the reflective layer 63 is referred to as an element layer 12.

The cathode 56 is a laminated body of an electron injection buffer layer (no reference numeral) formed of LiF (lithium fluoride), Ca (calcium), or the like, and a conductive layer (no reference numeral). The whole area in the image display area 100 is at the same potential, and is electrically connected to a cathode line (not shown) formed on the element substrate 10 on the outside of the image display area. The conductive layer is formed of a metal thin film such as ITO, Al, and AgMg (silver-magnesium alloy), and has semi-semitransmissive reflectance, that is, a property of allowing about 50% of the irradiated light to pass and reflecting the remainder. For this reason, a micro-cavity, that is, an optical resonant structure is formed between the reflective layer 63 and the cathode 56. The organic EL element 50 can emit the white light generated in the light emitting functional layer 54 through the opposed substrate 11 while resonating the white light by the optical resonant structure.

The light emitting functional layer 54 is formed by laminating a total of five layers of a hole injection layer to easily inject holes from the pixel electrode 52, a hole transport layer to easily transport the injected holes to the light emitting layer, an organic EL layer emitting light by conduction, that is, by coupling of holes and electrons, an electron transport layer to easily transport the electrons injected from the cathode 56, to the organic EL layer, and an electron injection layer to easily inject electrons from the cathode 56, in order from the element substrate 10 side.

The organic EL layer is a layer emitting white light by the above-described coupling, and is formed of a high-molecule-based organic EL material or a high-molecule-based organic EL material. As described above, the organic EL layer is common among three kinds of pixels 46 (R, G, and B). In the organic EL device 1 and the like, the white light is made into any of the three primary colors of light by the optical resonant structure and the color filter 90, and then the light is emitted. Accordingly, the pixel 46 as a functional concept includes the organic EL element 50, and the color filter 90 together with elements such as the driving TFT 112 formed on the element substrate 10.

The color filter 90 and the partition 44 are formed on the surface of the cathode 56 with the protective layer 94 interposed therebetween. The protective layer 94 is formed by laminating a planarization layer 92 formed of an organic material such as acryl, and a seal layer 93 formed of an inorganic material such as SiO$_n$, in order from the element substrate 10 side. The planarization layer 92 mainly has a function of reducing a level difference of the outer frame portion of the pixel electrode 52, and a level difference between the pixel electrodes 52 adjacent to each other. The seal layer 93 mainly has a function of reducing a phenomenon in which moisture, etching liquid, or the like infiltrates into the formation area of the organic EL element 50 and the like.

The opposed substrate 11 is bonded onto the surface of the color filter 90 and the partition 44 with an overcoat layer 95 and a filling layer 96 interposed therebetween. The opposed substrate 11 needs transparency, but does not need heat resistance, and thus the opposed substrate 11 may be formed of general glass, plastic, or the like. The organic EL device 1 and the like are formed of elements formed on the opposed substrate 11, the element substrate 10 and between the both substrates. A polarization plate or the like may be provided on the surface of the opposed substrate 11.

The pixel electrode 52 is patterned to be fitted into the reflective layer 63 in the plan view except for the peripheral area of the second contact hole 68. Accordingly, except for the peripheral area, the light generated in the light emitting functional layer 54 is resonated between the reflective layer 63 and the cathode 56 such that light in a specific wavelength range is highlighted, then passes through the cathode 56, and is emitted to the color filter 90 side. The light which is not included in each wavelength range of the three primary colors of light is absorbed by the color filter 90, becomes light with further improved color purity, and is emitted from the opposed substrate 11 side. As a result, an image with high quality is formed in the image display area 100 of the organic EL device 1.

As described above, since the resonance length fluctuates in the outer frame portion of the pixel electrode 52, light deviating from the wavelength range of the desired light may occur. For this reason, in the organic EL device 1 and the like, the partition 44 having the color filter as constituent elements is formed in the light shielding area 43 surrounding the periphery of the color filter 90 in the plan view, and the emission of the light which is not desired is reduced.

FIG. 5 is a cross-sectional view in the X direction, and is a schematic cross-sectional view illustrating a cross section taken along the line V-V shown in FIG. 2. In the drawing, the overcoat layer 95, the opposed substrate 11, and the like formed on the upside of the color filter 90 are not shown. Elements from the surface of the element substrate 10 to the reflective layer 63 are simplified and shown as the element layer 12 (see FIG. 4). In the following description, description of a part of elements is omitted.

As shown in the drawing, the color filter 90 and the partition 44 are formed on the upside of the cathode 56 with the protective layer 94, in which the planarization layer 92 and the seal layer 93 are laminated, interposed therebetween. As described above, the color filter 90 is formed of acryl resin in which a pigment is dispersion-equalized, that is, a transparent coloring layer. The transparent coloring layer may have an arbitrary color by changing the dispersion-equalized pigment. That is, it is possible to obtain a transparent coloring layer capable of allowing light in an arbitrary wavelength range to pass and absorbing the light in other wavelength ranges.

As described above, the color filter 90 serves as the narrowly defined color filter 90 in the pixel area 42, and serves as the partition 44 in the light shielding area 43. In the organic EL device 1, the red color filter 90R (the transparent coloring layer which becomes the red color filter 90R, that is, the red coloring layer) is formed in the whole area of the light shield area 43. Accordingly, at least a part of all the partitions 44 is formed of the red color filter 90R.

Specifically, the partition 44 around the red pixel area 42R is formed of only the red color filter 90R (reference numeral "44 (90)"). The partition 44 around the green pixel area 42G has a 2-layer structure including the red color filter 90R (reference numeral "44 (90)") of the lower layer, and the green color filter 90G (reference numeral "44 (90)") of the upper layer. The partition 44 around the blue pixel area 42B has a 2-layer structure including the red color filter 90R (reference numeral "44 (90)") of the lower layer, and the blue color filter 90B (reference numeral "44 (90)") of the upper layer. With such a configuration, in the organic EL device 1, the phenomenon that the light generated by the fluctuations in the resonance length in the outer frame portion of the pixel electrode 52 and deviating from the wavelength range of the desired light is emitted through the opposed substrate 11 is reduced. Hereinafter, the fluctuation and the like of the resonance length in the outer frame portion of the pixel electrode 52 will be described.

Figure 6A:
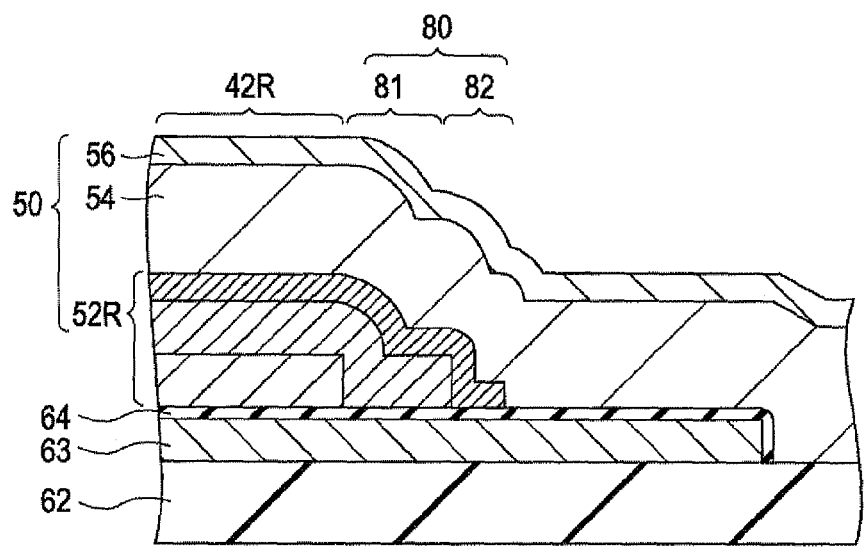
FIG. 6A and FIG. 6B are enlarged schematic cross-sectional views illustrating an outer frame portion of a pixel electrode.
Figure 6B:
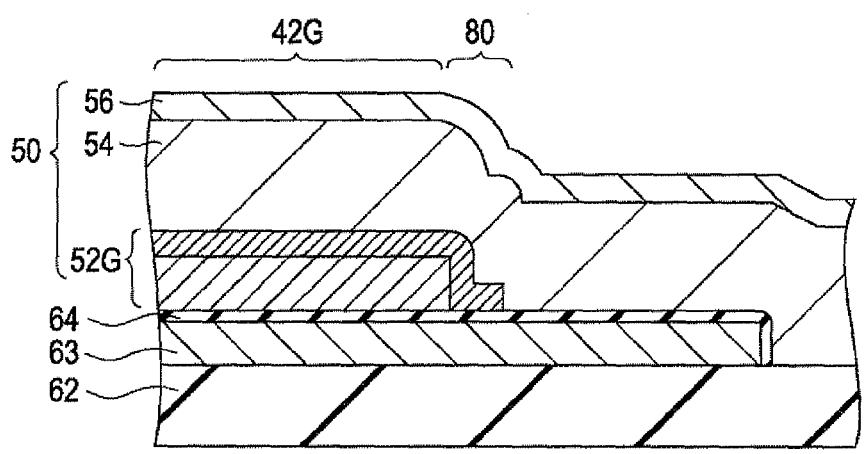

FIG. 6A and FIG. 6B are schematic cross-sectional views enlarging and illustrating the outer frame portion of the pixel electrode 52. FIG. 6A is a view enlarging and illustrating a part VIA shown in FIG. 5, that is, the outer frame portion of the red pixel electrode 52R. FIG. 6B is a view enlarging and illustrating a part VIB shown in FIG. 5, that is, the outer frame portion of the green pixel electrode 52G. In both drawings, only the second interlayer insulating film 62 is shown on the lower layer of the reflective layer 63, and elements from the second interlayer insulating film 62 to the element substrate 10 are not shown. Elements formed on the upper layer of the cathode 56 are also not shown.

As described above, the pixel electrode 52 is formed by laminating the ITO thin film. Accordingly, as shown in FIG. 6A, a level difference area 80 including a first level difference area 81 and a second level difference area 82 are formed in the outer frame portion (i.e., a ring-shaped area surrounding the red pixel area 42R) of the red pixel electrode 52R. In the first level difference area 81, the red pixel electrode 52R is formed of a laminated body of a second layer ITO thin film and a third layer ITO thin film. In the second level difference area 82, the red pixel electrode 52R is formed of only the third layer ITO thin film.

As shown in FIG. 6B, the level difference area 80 is formed in the outer frame portion (i.e., a ring-shaped area surrounding the green pixel area 42G) of the green pixel electrode 52G. In the level difference area 80, the green pixel electrode 52G is formed of only the third layer ITO thin film.

As shown in FIG. 4, the green pixel electrode 52G is formed by laminating the second layer ITO thin film and the third layer ITO thin film, except for the vicinity of the outer frame portion and the second contact hole 68. The layer thickness of the 2-layer ITO thin film is set to be the sum of the layer thickness of the two combined layers, the layer thickness of the light emitting functional layer 54, and the layer thickness of the reflective-layer protective layer 64, that is, such that the total layer thickness is a thickness (length) capable of highlighting the green light through resonance. The blue pixel electrode 52B is formed of the third layer ITO thin film. The layer thickness of the third layer ITO thin film is set to be the sum of the layer thickness of the third layer ITO thin film, the layer thickness of the light emitting functional layer 54, and the layer thickness of the reflective-layer protective layer 64, that is, the total thickness is a thickness (length) capable of highlighting the blue light by resonance.

Accordingly, the green light and the blue light are highlighted by resonance in the ring-shaped area with a predetermined width surrounding the red pixel area 42R, and are emitted to the opposed substrate 11 (see FIG. 4) side through the cathode 56. Similarly, the blue light is highlighted by resonance in the ring-shaped area with a predetermined width surrounding the green pixel area 42G, and is emitted to the opposed substrate 11 (see FIG. 4) side through the cathode 56. Although an enlarged view is not shown, mainly, light close to a shorter wavelength than that of the blue light is highlighted and emitted in the ring-shaped area with a predetermined width surrounding the blue pixel area 42B by fluctuations in the layer thickness of the blue pixel electrode 52B. In this case, in the red color filter 90R (the transparent coloring layer which becomes the red color filter 90R), a function of shielding (blocking) the green light and the light close to the shorter wavelength than that of the green light is high, and thus the red color filter 90R can sufficiently accomplish the function as the partition 44.

Figure 7:
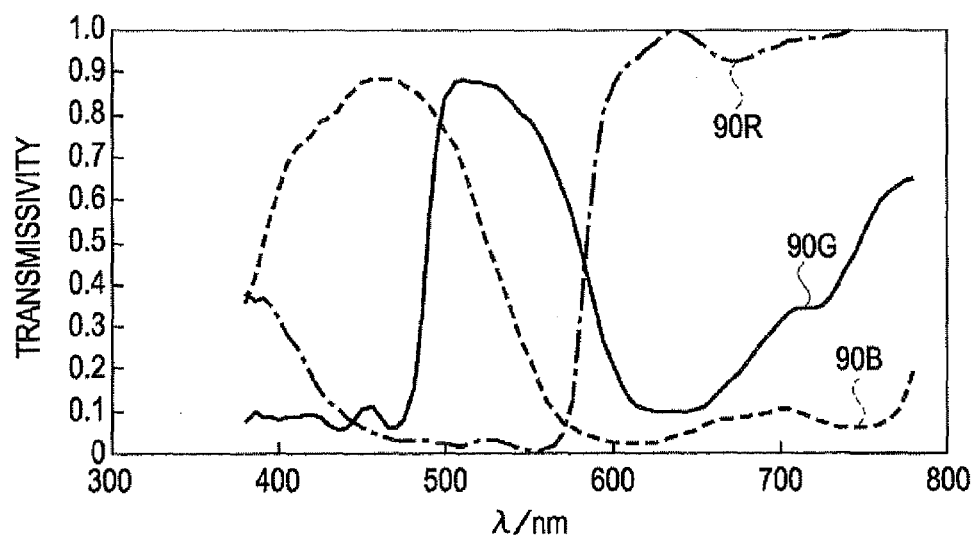
FIG. 7 is a diagram illustrating spectrum transmittance characteristics of color filters.

FIG. 7 is a diagram illustrating a wavelength-transmissivity property of a negative type photosensitive acryl material which composes the color filter 90 in which a pigment is dispersed, that is, a spectrum transmission property, for each color of R, G, and B. As shown in the drawing, the red color filter 90R has a high light shielding property (a cutoff property) against the green light and the blue light. Accordingly, in the organic EL device forming a color image using the three primary colors of light, the partition 44 is formed of the red color filter 90R, and thus it is possible to sufficiently reduce emitting the light with a wavelength which is not very appropriate. The "sufficiently" means a substantially changeless level, as compared with the case of using the partition 44 formed of a resin material in which the black pigment is dispersion-equalized, or a metal material such as Al.

The partition 44 is formed of the color filter 90, and thus it is possible to reduce production costs, as compared with the case of separately forming the partition 44 with a material different from that of the color filter 90. Accordingly, in the organic EL device 1 of the embodiment, lower costs are achieved with display quality being maintained. Since the process of forming the thin film and the patterning process is reduced at least once as compared with the case of separately forming the partition with the above-described material or the like, influence on the organic EL element 50 and the like also decreases and reliability is improved.

Second Embodiment

Figure 8:
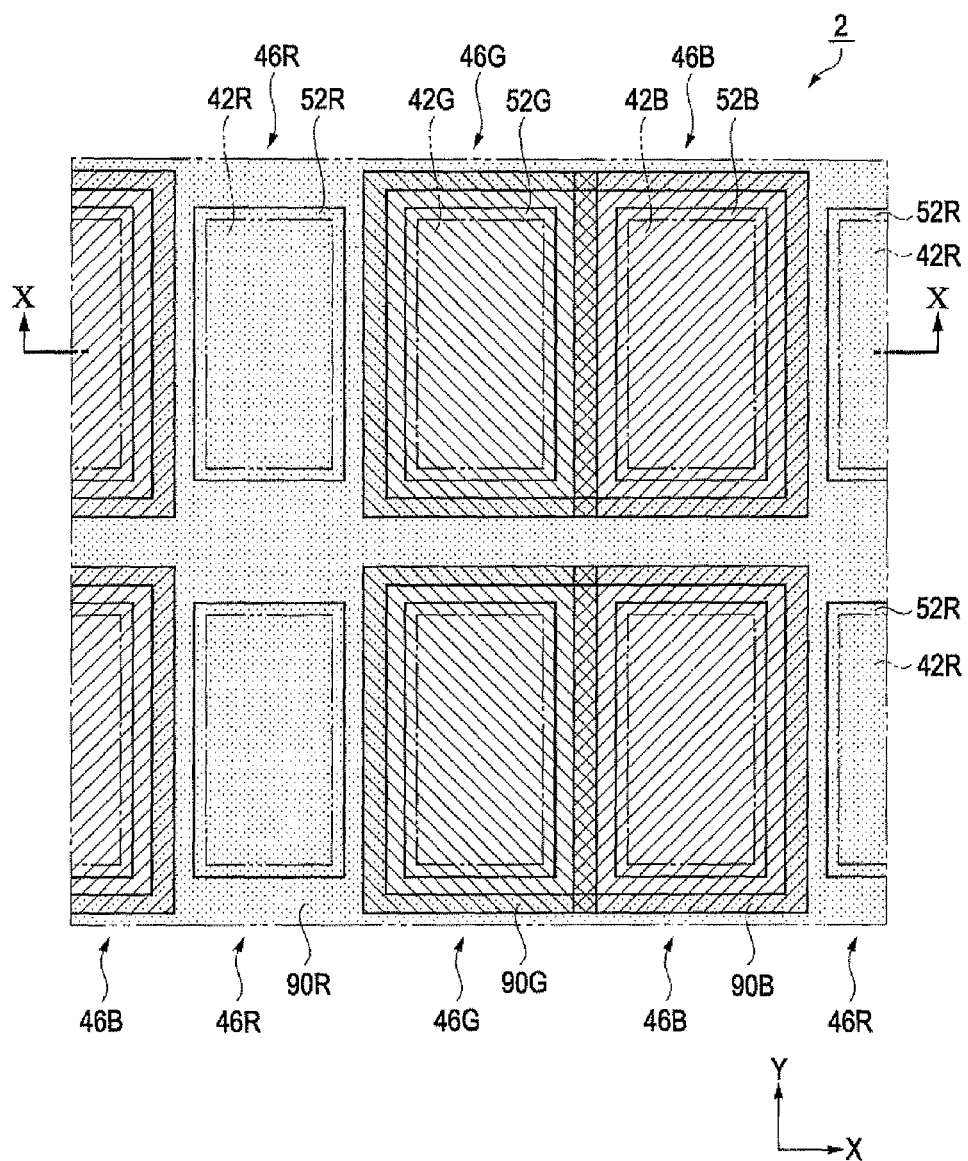
FIG. 8 is a schematic plan view illustrating an, organic EL device according to a second embodiment.

An organic EL device as an electro-optic device according to a second embodiment of the invention will be described with reference to FIG. 8 to FIG. 10. FIG. 8 is a schematic plan view illustrating an arrangement of pixels 46, pixel electrodes 52, and the like in the image display area 100 (see FIG. 1) of the organic EL device 2, and an area where the color filter 90 is formed, according to the second embodiment. The organic EL device 2 according to the embodiment has a configuration similar to that of the organic EL device 1 of the first embodiment. A configuration of the element layer 12 and the like is the same, and a configuration of the color filter 90 and the partition 44 and the distance of the pixel electrodes 52 in the Y direction are different from those of the organic EL device 1. The same reference numerals and signs are given to the common constituent elements, and a part of description thereof is omitted. A circuit diagram and a cross-sectional view in the Y direction are omitted.

As shown FIG. 8, similarly to the above-described organic EL device 1, the organic EL device 2 is provided with three kinds of pixels 46 (R, G, and B) corresponding to the three primary colors regularly formed in the image display area 100. Each of the pixels 46 is provided with a pixel electrode 52, and a pixel area 42 (shown by a two-dot chain line) included in the pixel electrode in the plan view. An area other than the pixel area 42 in the image display area 100 is a light shielding area 43. Since the pixel electrodes 52 are formed in a matrix, the plan shape of the light shielding area 43 becomes a lattice shape having a stripe-shaped part extending in the X direction and a stripe-shaped part extending in the Y direction.

At least one layer of the color filter 90 is formed in the whole area in the image display area 100. The color filter is a widely defined color filter 90, and is a transparent coloring layer in which any pigment among red, green, and blue are dispersion-equalized. Similarly to the organic EL device 1, in the transparent coloring layer, a part formed in the pixel area 42 becomes the original (narrowly defined) color filter 90, and a part formed in the light shielding area 43 becomes the partition 44 (see FIG. 10).

In the organic EL device 2, the distance between the pixels 46 adjacent to each other in the Y direction is formed to be larger than the distance between the pixels 46 adjacent to each other in the X direction. Accordingly, in the light shielding area 43, the width of the part extending in the X direction becomes wider than the width of the part extending in the Y direction. When individual pixels 46 are sub-pixels and a group of three colors of pixels 46 (R, G, and B) is defined as a "pixel", it is conceivable that the distance between the "pixels" adjacent to each other in the Y direction are formed to be wider than the distance between "sub-pixels" in the same "pixel". Among the 3 color filters 90, the green color filter 90G and the blue color filter 90B are formed only in the corresponding pixel area 42 and a ring-shaped area surrounding the pixel area. Meanwhile, in the light shielding area 43, the red color filter 90R is formed even in an area separating the pixels 46 adjacent to each other in the Y direction, that is, the stripe-shaped area extending in the X direction.

Figure 9A:
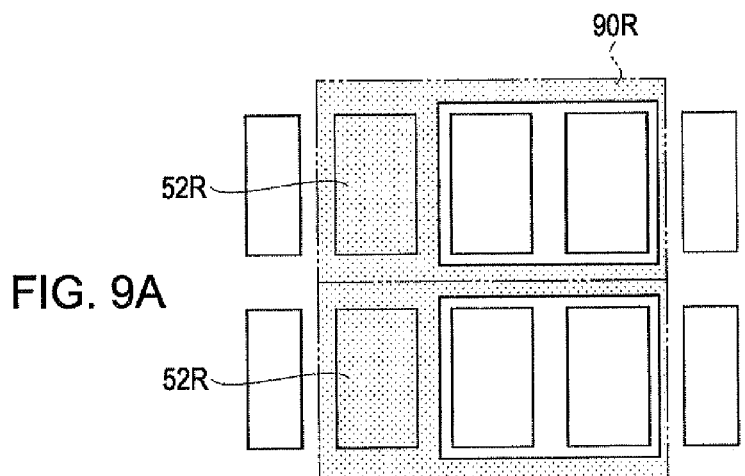
FIG. 9A to FIG. 9C are diagrams illustrating an area where the color filters are formed for each color of the color filters in the organic EL device according to the second embodiment.
Figure 9B:
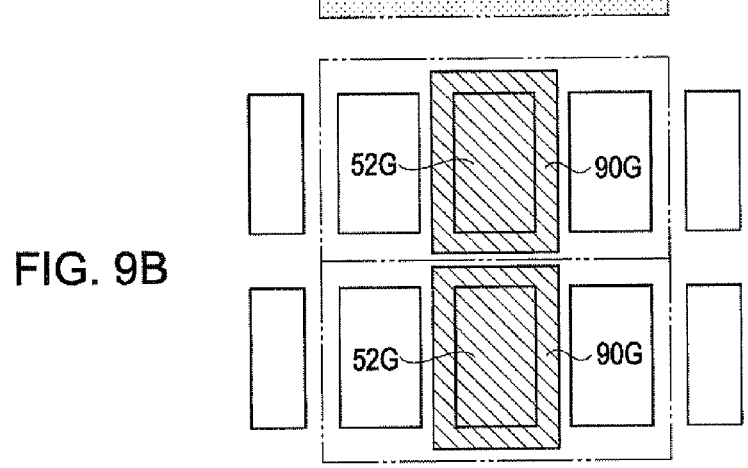
Figure 9C:
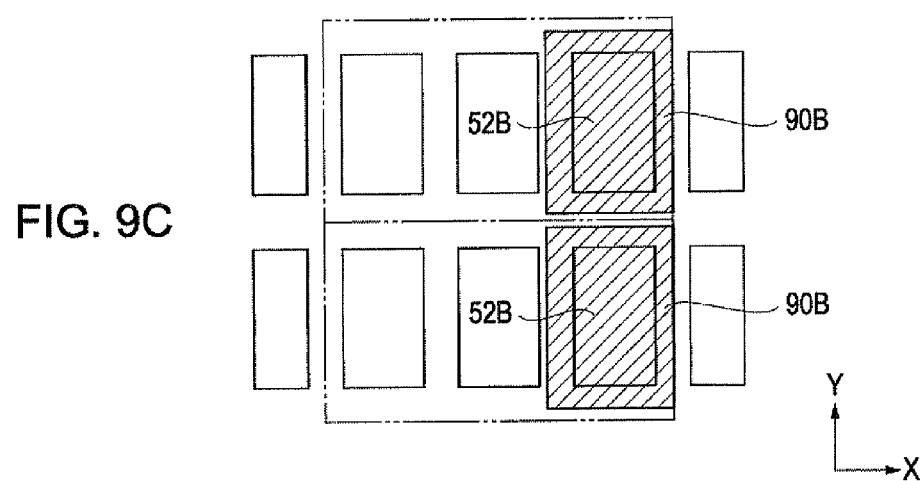

FIG. 9A to FIG. 9C are diagrams illustrating formation areas of the (widely defined) color filters in the organic EL device 2 of the embodiment for each color of the color filters. FIG. 9A is a diagram illustrating the formation area of the red color filter 90R, FIG. 9B is a diagram illustrating the formation area of the green color filter 90G, and FIG. 9C is a diagram illustrating the formation area of the blue color filter 90B. In the drawings, the rectangular areas surrounded with the two-dot chain lines are areas (ranges) including one "pixel" when the individual pixels 46 are defined as "sub-pixels". Accordingly, the areas surrounded with the two-dot chain lines are the minimum areas where light (i.e., an arbitrary color of light) in an arbitrary wavelength distribution can be emitted with an arbitrary intensity.

As shown in the drawings, the formation area of the green color filter 90G and the formation area of the blue color filter 90B are similar to the formation areas in the organic EL device 1 according to the first embodiment. That is, in the plan view, the formation areas are formed to overlap the pixel electrodes 52 (G and B) and a ring-shaped area with a predetermined width surrounding the pixel electrodes. However, the formation areas are different from the formation areas in the organic EL device 1; the formation areas of the green color filter 90G and the blue color filter 90B partially overlap in the area where both pixel electrodes (G and B) are opposed in the plan view.

The formation area of the red color filter 90R is different from the formation area in the organic EL device 1. That is, the red color filter 90R is not formed at a part where the green pixel 46G and the blue pixel 46B are adjacent to each other in the X direction. In addition, the red color filter 90R is not formed in an area adjacent to the green pixel area 42G and the blue pixel area 42B. In the light shielding area 43 of a part where the pixels 46 are adjacent to each other in the Y direction, that is, a part extending in the X direction in the light shielding area 43, the red color filter 90R is formed only at the center, and is not formed at both side parts. Accordingly, the ring-shaped area surrounding the pixel areas 42 (R, G, and B), that is, the area adjacent to the pixel areas 42 (R, G, and B), single-layer color filters 90 (R, G, and B) are formed.

The (widely defined) color filter 90 in such embodiments has an advantage of easy formation, as compared with the color filter 90 of the organic EL device 1 of the first embodiment. The red color filter 90R does not need to be subjected to patterning such that the peripheral line of the red color filter and the peripheral line of the green pixel area 42G or the peripheral line of the blue pixel area 42B coincide with each other, and thus the difficulty of the photolithography process is reduced. For this reason, in the organic EL device 2 of the embodiment, it is possible to obtain an effect of reducing production costs.

Figure 10:
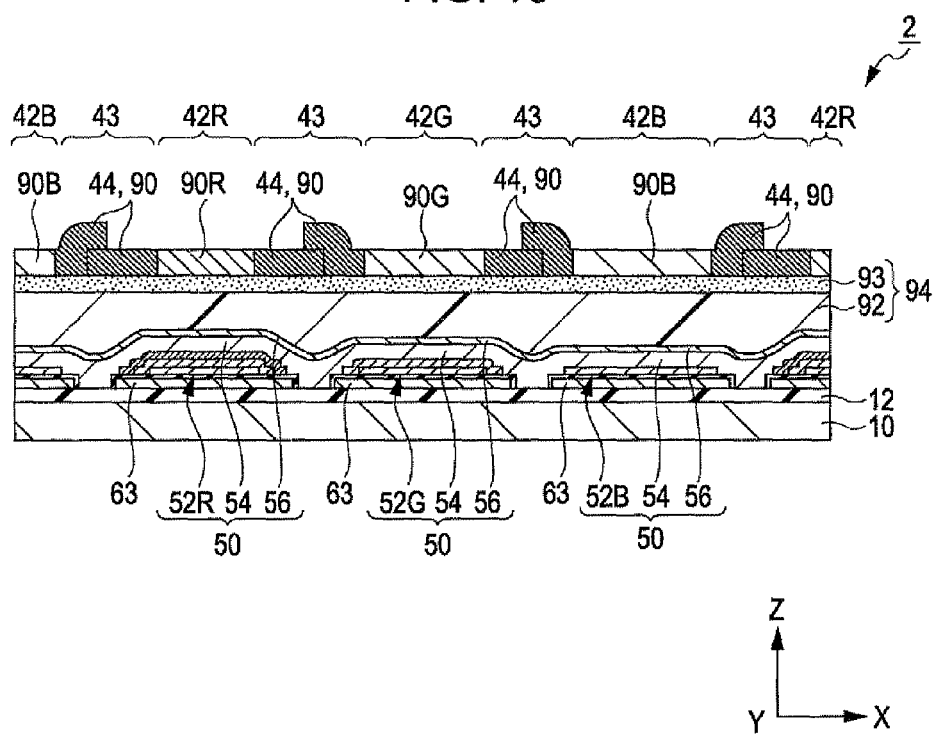
FIG. 10 is a schematic cross-sectional view illustrating a cross section in the X direction of the organic EL device according to the second embodiment.

FIG. 10 is a schematic cross-sectional view illustrating a cross section taken along the line X-X shown in FIG. 8, and is a schematic cross-sectional view of the organic EL device 2 in the X direction. As shown in the drawing, the widely defined color filter 90 is formed to completely cover the corresponding pixel areas 42 (R, G, and B) including the ring-shaped area surrounding the pixel areas. A part overlapping with the pixel areas 42 serves as the narrowly defined color filter 90, a part overlapping with the light shielding area 43 between the pixel areas 42 serves as the partition 44 (reference numerals "44 (90)"). Accordingly, similarly to the organic EL device 1 described above, the photolithography process after the organic EL element 50 is formed, that is, the film forming process and the patterning process on the surface of the protective layer 94 covering the organic EL element 50 are reduced. As a result, burden on the organic EL element 50 with low corrosion resistance and heat resistance is reduced, and reliability of the organic EL device is improved.

As shown in the drawing, in the organic EL device 2 of the embodiment, the narrowly defined color filter 90, that is, the color filter 90 on the pixel area 42 and the partition 44 are formed of a continuous transparent coloring layer. That is, only the partition 44 is not separately formed, and a delicate pattern between the pixel areas 42 adjacent to each other in the X direction is not formed. For this reason, adhesion to the protective layer 94 of the partition 44 and the color filter 90 is improved, and reliability is improved.

The organic EL device 2 of the embodiment has a problem of a light shielding property of the outer frame portion of the green pixel electrode 52G, that is, a light shielding property in the ring-shaped area surrounding the green pixel area 42G. As described above, in the ring-shaped area surrounding the green pixel area 42G, the light close to the shorter wavelength than that of the green light tends to be highlighted by fluctuations in the resonance length. However, as shown in FIG. 7, the green color filter 90G (green coloring layer) has a sufficient light shielding property as compared with that against the blue light, which is slightly inferior to the red color filter 90R. For this reason, there is little influence on performance of the green pixel 46G. Therefore, in the organic EL device 2 of the embodiment, lowering of costs and reliability are sufficiently improved with the effect described above.

Third Embodiment

Figure 11:
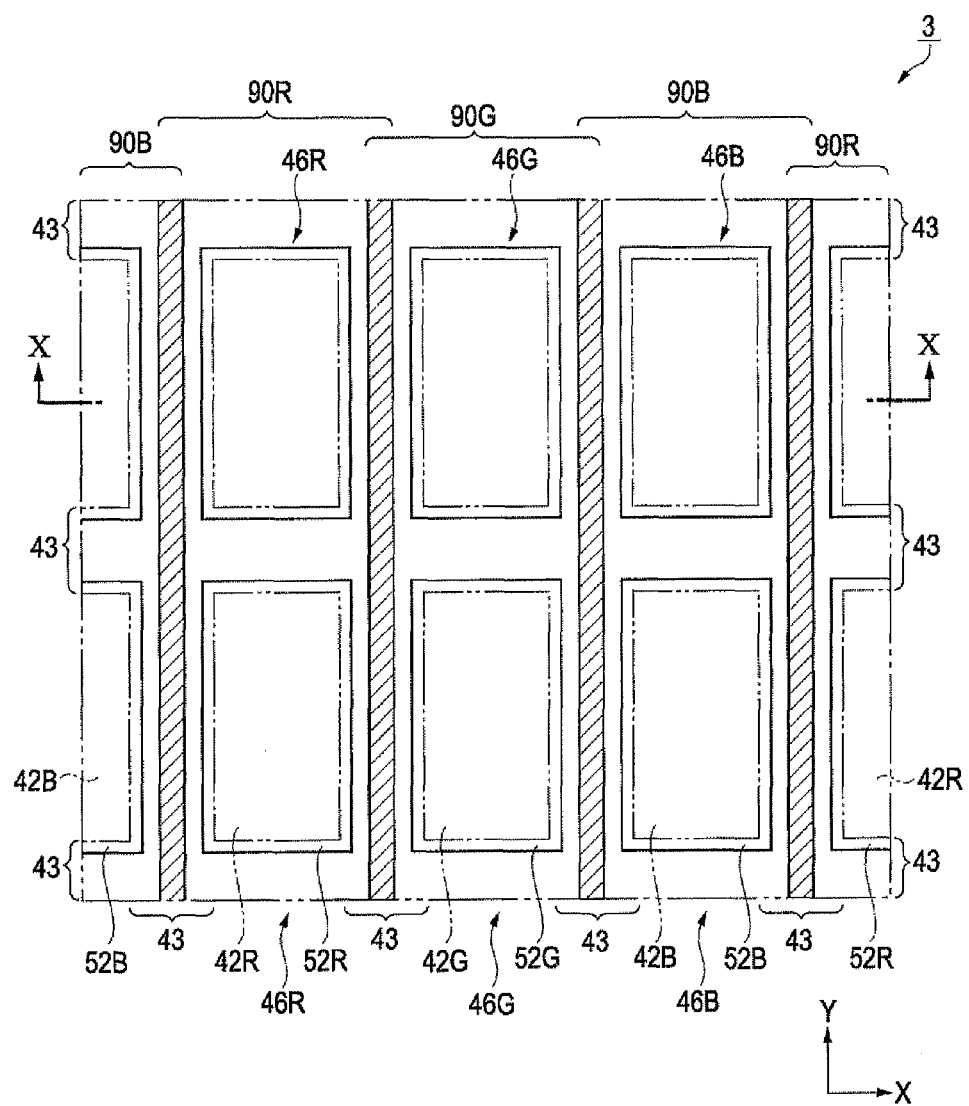
FIG. 11 is a schematic plan view illustrating an organic EL device according to a third embodiment.

Next, an organic EL device as an electro-optic device according to a third embodiment of the invention will be described. FIG. 11 is a schematic plan view illustrating arrangement of pixels 46 and pixel electrodes 52 in an image display area 100 (see FIG. 1) of an organic EL device 3 according to the third embodiment, and an area where color filters 90 are formed. The organic EL device 3 according to the embodiment has a configuration similar to the organic EL device 1 and the organic EL device 2 described above, and there is a difference in the configuration of the (widely defined) color filter 90 and the partition 44. The same reference numerals and signs are given to the common constituent elements, a part of description thereof is omitted, and a circuit diagram and a cross-sectional view in the Y direction are not shown. A cross-sectional view in the X direction of the organic EL device 3 according to the embodiment is substantially the same as the cross-sectional view of the organic EL device 2 according to the second embodiment shown in FIG. 10. The description of the organic EL device 3 of the embodiment is performed using only the schematic plan view of FIG. 11.

As shown in FIG. 11, similarly to the above-described organic EL devices of the embodiments, the organic EL device 3 is provided with three kinds of pixels 46 (R, G, and B) corresponding to the three primary colors regularly formed in the image display area 100. Similarly to the pixel 46 of the organic EL device 1 described above, each of the pixels 46 has an optical resonant structure between the reflective layer 63 (see FIG. 4) and the cathode 56 (see FIG. 4), and the layer thickness of the pixel electrode 52 is formed according to (colors of) emitted light. In the organic EL device 3, white light generated in the light emitting functional layer 54 (see FIG. 10) is considered as light in a specific wavelength range by the optical resonant structure and the color filter 90, and then is emitted. Each of the pixels 46 is provided with a pixel electrode 52, and a pixel area 42 included in the pixel electrode in the plan view. The distance between the pixel areas 42 adjacent to each other is the same in the X direction and the Y direction. Accordingly, the width of the light shielding area 43, that is, the width of a stripe-shaped part extending in the X direction and the width of a stripe-shaped part extending in the Y direction are the same.

As shown in the drawing, the color filter 90 of the organic EL device 3 is formed in a stripe shape extending in the Y direction in the plan view. In the drawing, the color filter 90 is a widely defined color filter 90. The width of the color filter 90, that is, a size in the X direction is over a pitch (about 5 μm in the organic EL device 3 of the embodiment) of the pixel electrodes 52 in the X direction. The color filter 90 is formed such that a center line extending in the Y direction substantially coincides with a center line extending in the Y direction of the corresponding pixel electrode 52. Accordingly, in the hatched area in FIG. 11, that is, an area between the pixel electrodes 52 adjacent to each other in the X direction, the color filter 90 with the other color is laminated.

Accordingly, the cross section in the X direction of the organic EL device 3 is substantially the same as that of the cross-sectional view of the organic EL device 2 according to the second embodiment shown in FIG. 10 regardless of the position of the section line. That is, at least a part of the partition 44 (see FIG. 10) is formed by laminating a 2-layer color filter 90 with colors different from each other. As described above, the color filter 90 has a function of allowing light in a wavelength range corresponding to any of the three primary colors of light to pass, and absorbing light in other wavelength ranges. Accordingly, the layer on which the 2-layer color filter 90 with different colors is laminated has absorptiveness for the light in the wide wavelength range, and has a high light shielding property.

The organic EL device 3 of the embodiment is characterized in that the color filter 90 is formed by a configuration of a stripe-shaped pattern having a width wider than a pitch in the X direction of the pixel electrodes 52. Since high-precision patterning is not performed, the degree of difficulty of the patterning process is further reduced. In addition, since three kinds (three colors) of the color filters 90 can be subjected to patterning in the same shape, a photomask can be made in common for three colors.

As described above, at least a part of the partition 44 separating the pixel areas 42 corresponding to different colors is formed by laminating the color filters 90 with two colors, and thus the light shielding property is high. Since the color filter 90 is' formed of only the stripe-shaped part extending in the Y direction, adhesion is further improved. Accordingly, the organic EL device 3 of the embodiment further achieves lower costs while maintaining display quality and reliability.
Fourth Embodiment Next, a method of producing an organic EL device as an electro-optic device according to a fourth embodiment of the invention will be described. A target of a production method of the embodiment is the organic EL device 1 according to the first embodiment described above. Methods of producing the organic EL device according to the embodiment and the fifth embodiment to be described later are characterized in a process of forming the color filter 90. Elements such as the driving TFT 112 (see FIG. 4) constituting the element layer 12, and the organic EL elements 50 (see FIG. 4) are formed by a known technique. In this embodiment and the fifth embodiment to be described later, description is performed from a step in which the protective layer 94 is formed. As for the constituent elements described in the first embodiment described above, description is partially omitted. The same is applied to the fifth embodiment to be described later.

FIG. 12A to FIG. 13D are process cross-sectional views illustrating a method of producing the organic EL device according to the fourth embodiment. In FIG. 12A to FIG. 13D, similarly to FIG. 5 described above, elements from the surface of the element substrate 10 to the reflective layer 63 are simplified and shown as the element layer 12 (see FIG. 4). A process of forming the organic EL element 50 described above is a first process in the embodiment. Accordingly, the description of the embodiment starts from description of a second process. After the first process is performed, that is, after forming the organic EL element 50, a process of laminating the planarization layer 92 and the seal layer 93 on the surface of the organic EL element to form the protective layer 94 is performed. Hereinafter, a process sequence will be described.

In the drawings (FIG. 12A to FIG. 15D) used in the description of the embodiment and the fifth embodiment to be described later, reference numeral "44 (90)" or "90" is given to the transparent coloring layers (35, 36, and 37) after patterning.

Figure 12A:
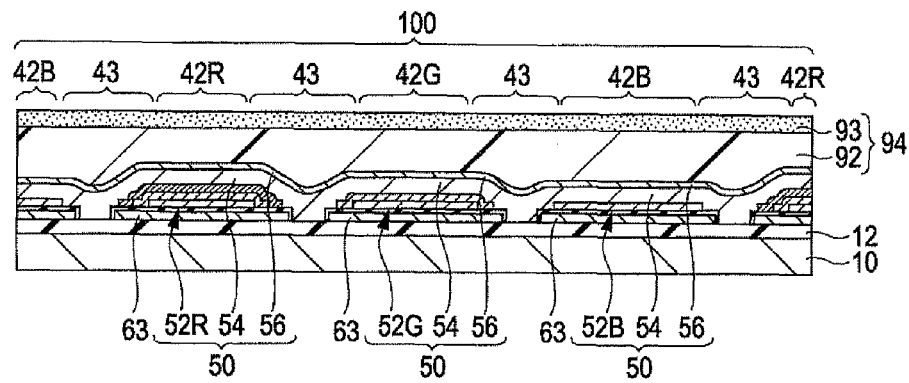
FIG. 12A to FIG. 12C are process cross-sectional views illustrating a method of producing an organic EL device according to a fourth embodiment.

First, as the second process, as shown in FIG. 12A, the inside of the image display area 100 is partitioned into the pixel area 42 that is an area included in the pixel electrode 52 in the plan view and is an area where the organic EL element 50 emits light, and the light shielding area 43 that is an area other than the pixel area. The pixel area 42 is partitioned into the red pixel area 42R, the green pixel area 42G, and the blue pixel area 42B according to colors of light emitted from the pixel area.

Figure 12B:
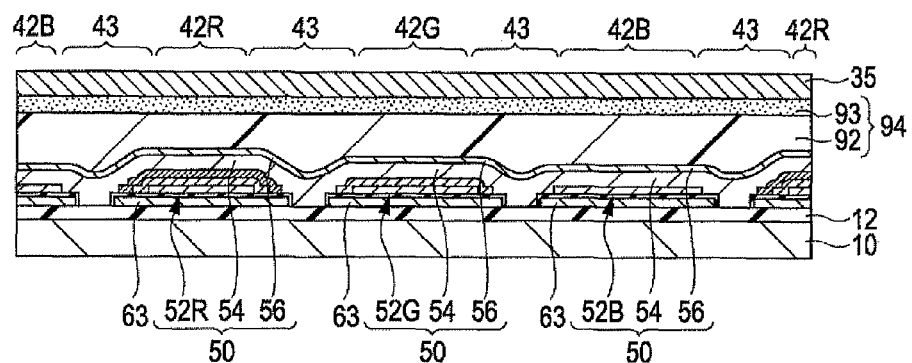
Figure 12C:
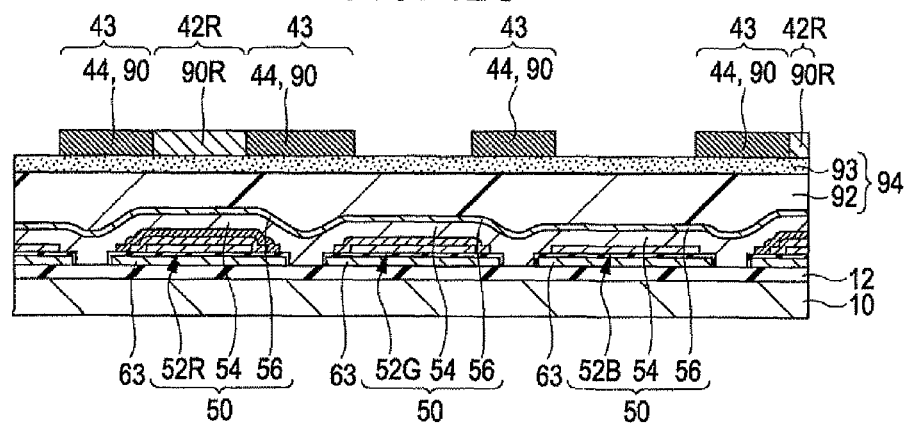

Then, as a third process, the red coloring layer 35 is formed in the red pixel area 42R and the light shielding area 43. First, as shown in FIG. 12B, the red coloring layer 35 is formed on the entire face of the protective layer 94. The red coloring layer 35 is a layer formed of a negative type photosensitive acryl in which a material allowing light in the range of the red pigment, that is, about 610 nm to about 750 nm to pass and absorbing light in other wavelength ranges is dispersed. Then, the red coloring layer is subjected to patterning by photolithography, and the red coloring layer is selectively removed from an area except for two areas of the red pixel area 42R and the light shielding area 43. The selectively remaining red coloring layer 35 is subjected to a post-baking process, that is, a heating process, to be hardened. In such a manner, as shown in FIG. 12C, the red coloring layer 35 is made to remain only in the two areas described above.

As described above, reference numeral "44 (90)" or "90" is given to the red coloring layer 35 after patterning. The red coloring layer 35 after patterning corresponds to the widely defined red color filter 90R in the first to third embodiments described above. In the red coloring layer 35, a part remaining in the red pixel area 42R serves as the red color filter 90R. A part remaining in the light shielding area 43 serves as the partition 44 with a single layer of the red coloring layer, or in a state where it is laminated with a transparent coloring layer with a different color. The photolithography is a method of sequentially performing an exposure process and an etching process on a thin film that is a target for patterning. In the embodiment, the thin film that is the target is the photosensitive acryl, and thus a development process also serves as the etching process.

Then, as a fourth process, the green coloring layer 36 is formed on the green pixel area 42G, and the blue coloring layer 37 is formed on the blue pixel area 42B. As described above, the green coloring layer 36 is a layer in which a material allowing light in the wavelength range of about 500 nm to about 560 nm to pass and absorbing light in other wavelength ranges is dispersed, and the blue coloring layer 37 is a layer in which a material allowing light in the wavelength range of about 435 nm to about 480 nm to pass and absorbing light in other wavelength ranges is dispersed.

Figure 13A:
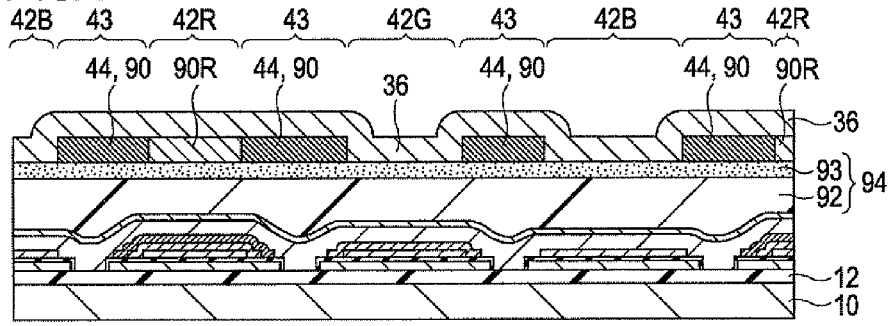
FIG. 13A to FIG. 13D are process cross-sectional views illustrating the method of producing the organic EL device according to the fourth embodiment.
Figure 13B:
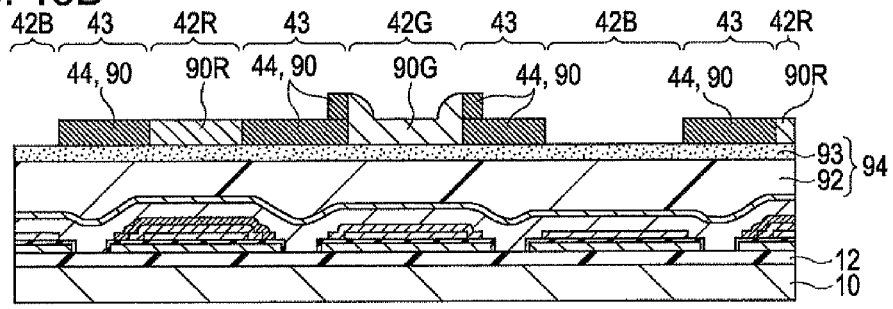

First, as shown in FIG. 13A, the green coloring layer 36 is formed on the entire face of the protective layer 94 (and on the previously formed red color filter 90R). Then, the green coloring layer is subjected to patterning by photolithography, and the green coloring layer is selectively removed from an area except for two areas of the green pixel area 42G and the ring-shaped area surrounding the green pixel area. The green coloring layer after patterning is hardened by a post-baking process to form the green coloring layer 36 in two areas described above as shown in FIG. 13B.

At the time of patterning described above, the red color filter 90R and the partition 44 formed on the lower layer have been already hardened, and thus they are not damaged by etching liquid (i.e., development liquid).

The ring-shaped area described above is continuous from the corresponding pixel area 42, and is an area which does not reach the other pixel areas 42 adjacent to each other. Accordingly, the green coloring layer 36 is subjected to patterning to remain in an island-shaped area including the green pixel area 42G in the plan view. In the remaining green coloring layer 36, a part overlapping with the green pixel area 42G in the plan view serves as the narrowly defined green color filter 90G. In the remaining green coloring layer 36, a part overlapping with the ring-shaped area surrounding the green pixel area 42G serves as the partition 44. In the third process, the red coloring layer 35 remains around the green pixel area 42G up to the outer peripheral line of the green pixel area. Accordingly, in the ring-shaped area described above, that is, the light shielding area 43 surrounding the green pixel area 42G, the partition 44 formed of the red coloring layer 35 of the lower layer and the green coloring layer 36 of the upper layer is formed.

Figure 13C:
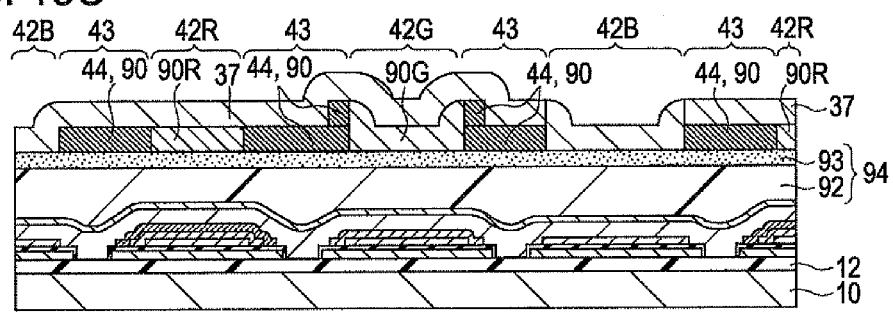
Figure 13D:
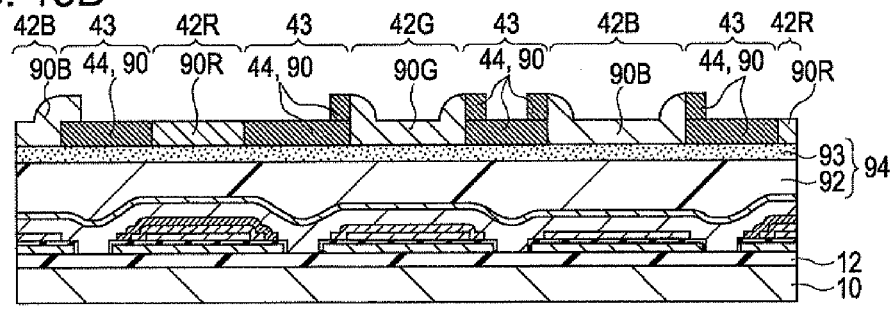

Then, as shown in FIG. 13C, the blue coloring layer 37 is formed on the entire face of the protective layer 94 (and on the previously formed red color filter 90R). As shown in FIG. 13D, the blue coloring layer is subjected to patterning by photolithography, and the blue coloring layer is selectively removed from an area except for two areas of the blue pixel area 42B and the ring-shaped area surrounding the blue pixel area. That is, the blue coloring layer 37 is made to remain in the blue pixel area 42B and the ring-shaped area surrounding the blue pixel area. The blue coloring layer 37 after patterning is hardened by a post-baking process. In the blue coloring layer 37 after patterning, a part overlapping with the blue pixel area 42B in the plan view serves as the narrowly defined blue color filter 90B. In the remaining blue coloring layer 37, a part overlapping with the ring-shaped area surrounding the blue pixel area 42B serves as the partition 44. In the third process, the red coloring layer 35 remains around the blue pixel area 42B up to the outer peripheral line of the blue pixel area. Accordingly, in the ring-shaped area described above, that is, the light shielding area 43 surrounding the blue pixel area 42B, the partition 44 formed of the red coloring layer 35 of the lower layer and the blue coloring layer 37 of the upper layer is formed.

By the above processes, the color filters 90 (R, G, and B) are formed in the pixel areas 42 (R, G, and B), 1-layer or 2-layer transparent coloring layers (35, 36, and 37) are formed in the light shielding area surrounding the pixel areas. The transparent coloring layers (35, 36, and 37) serve as the partition 44. After forming the red color filter 90R, any of the formation of the green color filter 90G and the formation of the blue color filter 90B may be first performed.

According to the production method of the embodiment, the color filters 90 (R, G, and B) are formed in the pixel areas 42 (R, G, and B), the partition 44 is formed in the lattice-shaped light shielding area 43 separating the pixel areas 42 adjacent to each other in the plan view. In the partition, the ring-shaped part surrounding the green pixel area 42G and the ring-shaped part surrounding the blue pixel area 42B become a shape in which the 2-layer transparent coloring layer is laminated. The transparent coloring layer is a layer absorbing light other than light in a specific wavelength range. Accordingly, the structure in which the 2-layer transparent coloring layer is laminated has a high light shielding property, that is, a function of absorbing the light in the wide wavelength range.

In the production method of the embodiment, it is possible to form the partition 44 having a high light shielding property without performing the film forming process of the light shielding material layer and the patterning process of the light shielding material layer. That is, it is possible to form the partition 44 without performing developing processes which are the heating process and the wet process in the film forming process and the photolithography process. Accordingly, it is possible described above, to reduce the influence of the heating process and the like on the organic EL element 50 positioned between the color filter 90 and the element substrate 10, and it is possible to produce the organic EL device with improved reliability. Since it is possible to reduce the number of performed film forming processes and the like, it is possible to produce the organic EL device with improved reliability while reducing production costs.

Fifth Embodiment

Next, a method of producing an organic EL device as an electro-optic device according to a fifth embodiment of the invention will be described. FIG. 14A to FIG. 15D are process cross-sectional views illustrating a method of producing the organic EL device according to the fifth embodiment. A target of a production method of the embodiment is the organic EL device 2 according to the second embodiment described above.

In FIG. 14A to FIG. 15D, similarly to FIG. 12A to FIG. 13D described above, elements from the surface of the element substrate 10 to the reflective layer 63 are simplified and shown as the element layer 12 (see FIG. 4). As described above, in the production method of the embodiment, similarly to the production method of the fourth embodiment described above, a process sequence will be described from a step in which the protective layer 94 is formed on the surface of the organic EL element after performing the first process of forming the organic EL element 50.

Figure 14A:
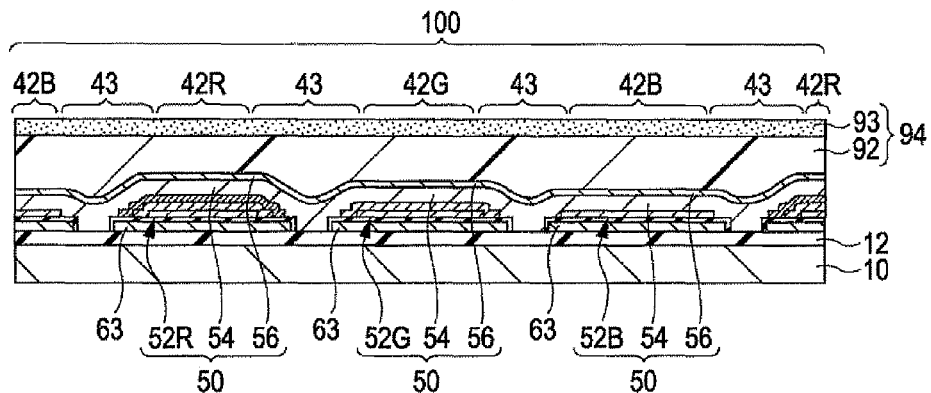
FIG. 14A to FIG. 14C are process cross-sectional views illustrating a method of producing an organic EL device according to a fifth embodiment.

First, as the second process, as shown in FIG. 14A, the inside of the image display area 100 is partitioned into the pixel area 42 that is an area included in the pixel electrode 52 and is an area where the organic EL element 50 emits light, and the light shielding area 43 that is an area other than the pixel area. The pixel area 42 is partitioned into the red pixel area 42R, the green pixel area 42G, and the blue pixel area 42B according to colors of light emitted from the pixel area.

Figure 14B:
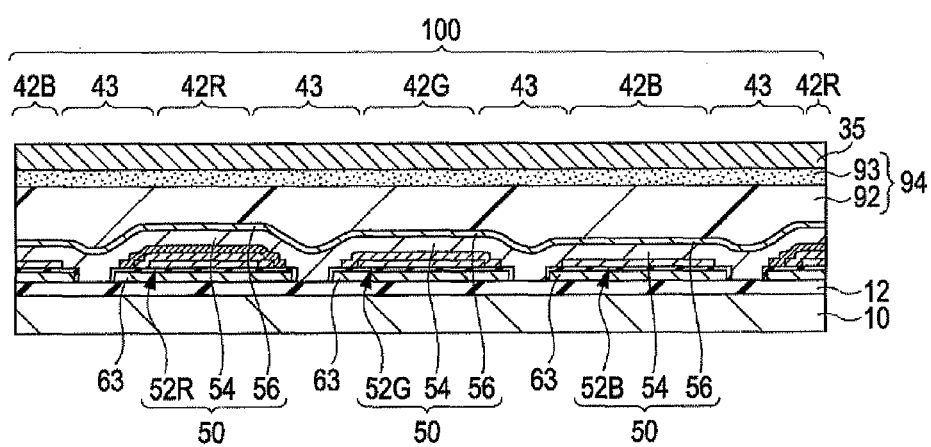
Figure 14C:
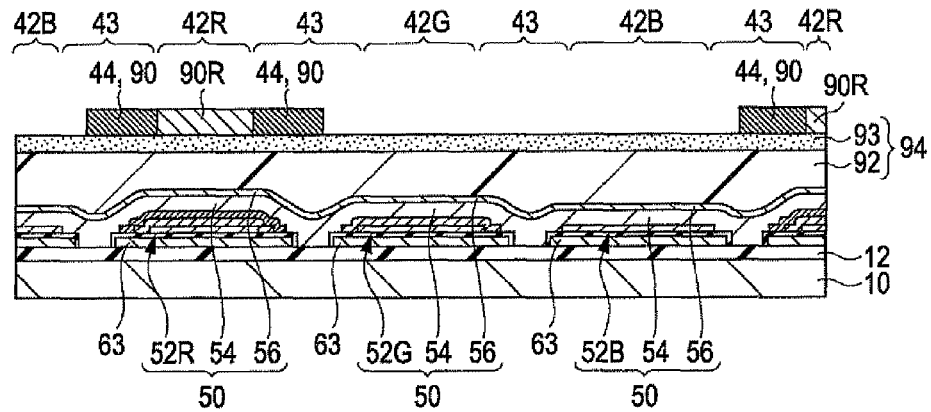

Then, as a third process, in the area shown in FIG. 9A, that is, the red pixel area 42R, and the center of the stripe-shaped part (the part separating the pixel areas 42 adjacent to each other in the Y direction) extending in the X direction and the area adjacent to the red pixel area 42R in the light shielding area 43, the red coloring layer 35 is formed. First, as shown in FIG. 14B, the red coloring layer 35 is formed on the entire face of the protective layer 94. The red coloring layer is subjected to patterning by photolithography to make the red coloring layer 35 remain in the area (the area shown in FIG. 9A) described above, as shown in FIG. 14C. The remaining red coloring layer 35 is subjected to a post-baking process to be hardened. In the hardened red coloring layer 35, a part overlapping with the red pixel area 42R serves as the (narrowly defined) red color filter 90R.

Figure 15A:
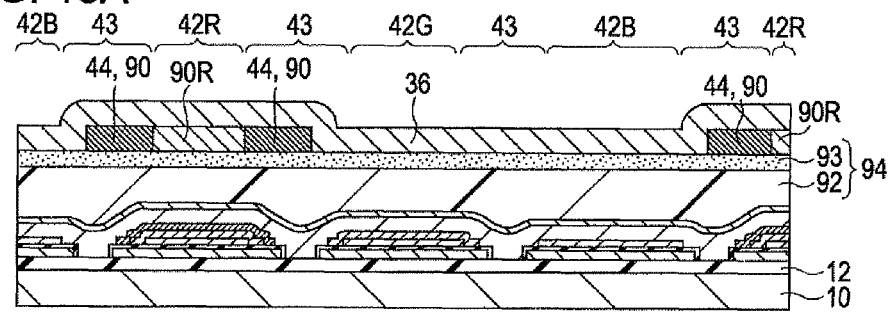
FIG. 15A to FIG. 15D are process cross-sectional views illustrating the method of producing the organic EL device according to the fifth embodiment.
Figure 15B:
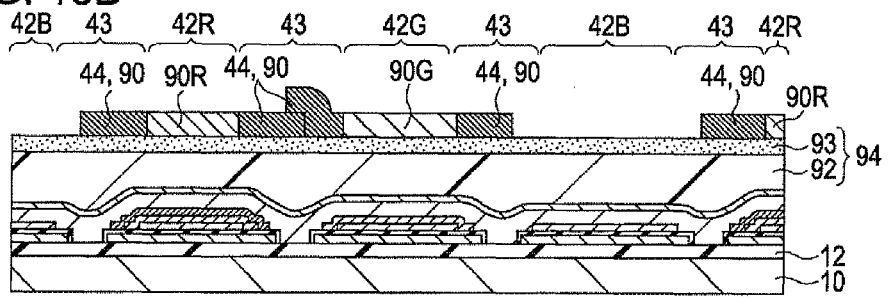
Figure 15C:
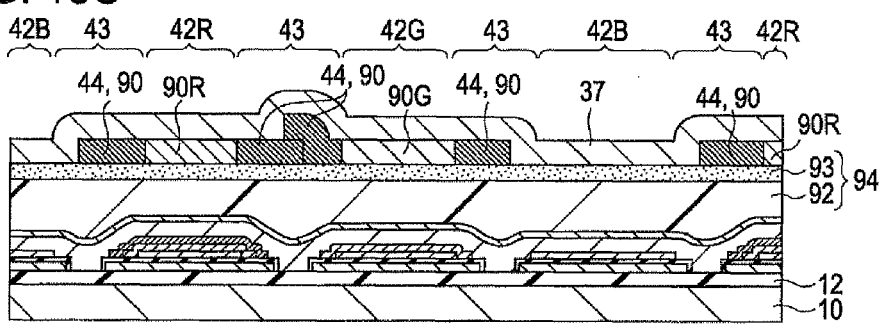
Figure 15D:
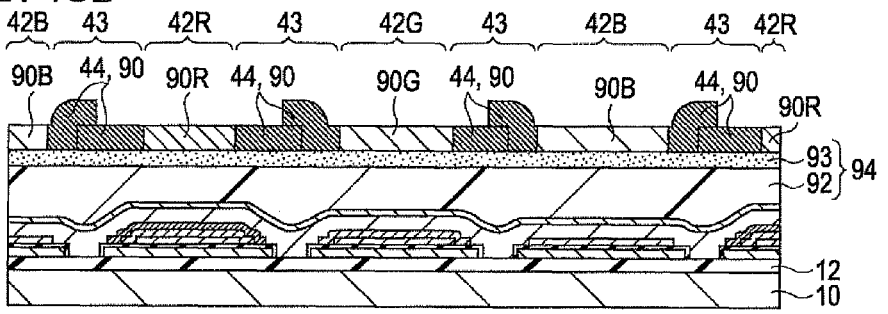

Then, as a fourth process, the green coloring layer 36 is formed in the green pixel area 42G and the area adjacent to the green pixel area 42G in the light shielding area 43. First, as shown in FIG. 15D, the green coloring layer 36 is formed on the entire face of the protective layer 94 (and on the previously formed red color filter 90R). Then, the green coloring layer 36 is subjected to patterning by photolithography, and the green coloring layer 36 is made to remain only in an area other than two areas described above as shown in FIG. 153. The remaining green coloring layer 36 is subjected to a post-baking process to harden the green coloring layer. In the hardened green coloring layer 36, a part overlapping with the green pixel area 42G serves as the (narrowly defined) green color filter 90G. A part overlapping with the light shielding area 43 serves as the partition 44.

The area of forming the green coloring layer 36 is an area where the widely defined green color filter 90G shown in FIG. 9B is formed. Specifically, it is an area where the green pixel area 42G and the ring-shaped area surrounding the green pixel area are combined. The ring-shaped area is an area where the outer frame portion finally overlaps with the other color filter 90. That is, the outer frame portion described above is an area overlapping with the (widely defined) blue color filter 90B formed in a fifth process to be described layer, on the side opposed to the blue pixel area 42B in the plan view. It is an area overlapping with the (widely defined) red color filter 90R formed in the third process, on the other three sides. Accordingly, as shown in the drawing, the green coloring layer 36 after patterning overlaps with the end of the previously formed red coloring layer 35, at the center of the light shielding area 43 between the red pixel area 42R and the green pixel area 42G.

Then, as a fifth process, the blue coloring layer 37 is formed in the blue pixel area 42B and the area adjacent to the blue pixel area 42B in the light shielding area 43. First, as shown in FIG. 15C, the blue coloring layer 37 is formed on the entire face of the protective layer 94 (and on the previously formed red color filter 90R). Then, the blue coloring layer 37 is subjected to patterning by photolithography, and the blue coloring layer 37 is made to remain only in an area other than two areas described above as shown in FIG. 15D. The remaining blue coloring layer 37 is subjected to a post-baking process to be hardened. In the hardened blue coloring layer 37, a part overlapping with the blue pixel area 42B serves as the (narrowly defined) blue color filter 90B. A part overlapping with the light shielding area 43 serves as the partition 44.

The area of forming the blue coloring layer 37 is an area where the widely defined blue color filter 90B shown in FIG. 9B is formed. Specifically, it is an area where the blue pixel area 42B and the ring-shaped area surrounding the blue pixel area are combined. The ring-shaped area is an area where the outer frame portion overlaps with the previously formed and widely defined color filter 90. That is, the outer frame portion described above is an area overlapping with the green coloring layer 36 formed in the fourth process described above, on the side opposed to the green pixel area 42G in the plan view, that is, the widely defined green color filter 90G. It is an area overlapping with the red coloring layer 35 formed in the third process, that is, the widely defined red color filter 90R, on the other three sides. Accordingly, as shown in the drawing, the blue coloring layer 37 after patterning overlaps with the end of the previously formed red coloring layer 35, at the center of the light shielding area 43 between the red pixel area 42R and the blue pixel area 42B. In addition, the blue coloring layer 37 overlaps with the end of the previously formed green coloring layer 36 at the center of the light shielding area 43 between the green pixel area 42G and the blue pixel area 42B.

By the processes above described, the (narrowly defined) color filters 90 (R, G, and B) corresponding to colors of emitted light of the pixel areas are formed in the pixel areas 42. The partition 44 is formed in the light shielding area 43 separating the pixel areas 42 adjacent to each other.

In the production method of the embodiment, it is possible to form the partition 44 without performing the film forming process of the light shielding material layer and the patterning process of the light shielding material layer. That is, it is possible to form the partition 44 without performing developing processes which are the heating process and the wet process in the film forming process and the photolithography process. Accordingly, it is possible to reduce the influence of the heating process and the like on the organic EL element 50 positioned between the color filter 90 and the element substrate 10, and it is possible to produce the organic EL device with improved reliability. In addition, it is possible to reduce production costs of the organic EL device.

In the production method of the embodiment, it is possible to form the partition 44 in which the outer frame portions of the color filters 90 overlap with each other in the light shielding area 43. In the partition 44 with such a configuration, since the outer frame portion of the previously formed color filter 90 covers the outer frame portion of the later formed color filter 90, adhesion is improved. Accordingly, it is possible to form the organic EL device with improved reliability of the color filter 90 and the partition 44.

Electronic Apparatus

Figure 16A:
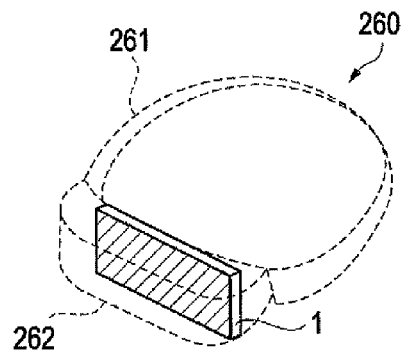
FIG. 16A to FIG. 16C are diagrams illustrating an electronic apparatus provided with the organic EL device according to the first embodiment as a component.
Figure 16B:
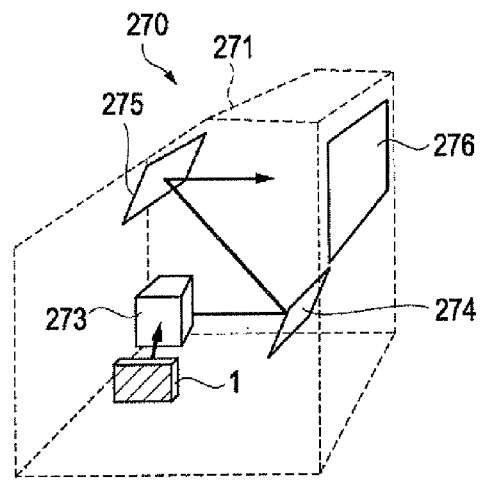
Figure 16C:
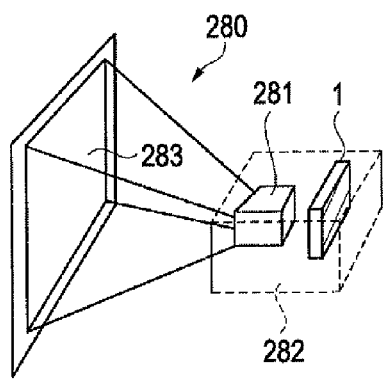

FIG. 16A to FIG. 16C are diagrams illustrating various electronic apparatuses provided with the organic EL device 1 of the first embodiment as a component. The organic EL device 2 of the second embodiment or the organic EL device 3 of the third embodiment may be used as a component, in addition to the organic EL device 1 described above.

FIG. 16A is a schematic diagram illustrating an application of a head mount display as an electronic apparatus. The head mount display 260 is provided with a band 261, an optical system housing portion 262, and the organic EL device 1. As described above, the organic EL device 1 may be used as an image displayer.

FIG. 16B is a schematic diagram illustrating an application of a rear-type projector. The rear-type projector 270 is provided with a synthetic optical system 273, mirrors 274 and 275, a screen 276, and the organic EL device 1 in a case 271. As described above, the organic EL device 1 may be used as an image displayer.

FIG. 16C is a schematic diagram illustrating an application of a front-type projector (mobile mini-projector). The front-type projector 280 is provided with an optical system 281 and the organic EL device 1 in a case 282, to display an image on a screen 283. When the front-type projector 280 is handled as a mobile mini-projector and an image is displayed on a white wall instead of the screen 283, it is possible to omit the screen 283, and thus it is possible to provide a more easily carried mobile mini-projector. As described above, the organic EL device 1 may be used as an image display device.

As described above, in the organic EL devices 1 to 3 according to the first to third embodiments, the photolithography process necessary to form the color filters 90 is reduced, and thus lower costs are achieved and reliability is improved. Accordingly, by applying the organic EL devices 1 to 3 to various electronic apparatuses, it is possible to provide electronic apparatuses with low cost and high quality.

As the embodiment of the invention, various modified examples are conceivable in addition to the embodiments described above. Hereinafter, the modified examples will be described.

Modified Example 1

In the organic EL devices (1 to 3) of the embodiments described above, the reflective layer 63 is subjected to patterning for each pixel electrode 52. However, the reflective layer 63 may not be subjected to the patterning at a part other than the vicinity of the second contact hole 68, but may be formed substantially on the entire face of the second interlayer insulating film 62. In such a shape, it is possible to reduce the level difference between the pixel area 42 and the light shielding area 43. As a result, it is possible to improve uniformity of the layer thickness of the color filter 90, and it is possible to improve display quality of the organic EL device.

Modified Example 2

In the organic EL devices (1 to 3) of the embodiments described above, the protective layer 94 formed between the organic EL element 50 (specifically the cathode 56) and the color filter 90 is formed by laminating the planarization layer 92 formed of an organic material such as acryl and the seal layer 93 formed of an inorganic material such as $SiO_n$, in order from the organic EL element 50 side. However, the configuration of the protective layer 94 is not limited to the 2-layer laminated body. For example, a layer formed of an inorganic material may be further formed between the planarization layer 92 and the cathode 56. With such a configuration, it is possible to improve a sealing property, and it is possible to improve reliability of the organic EL device.

The seal layer 93 may be a laminated body of a layer formed by a vacuum film forming method such as CVD and a layer formed by a wet film forming method. Since a planarization property is improved, it is possible to improve uniformity of the layer thickness of the color filter 90 and it is possible to improve display quality.

Modified Example 3

In the organic EL devices (1 to 3) of the embodiments described above, the pixel electrode 52 and the reflective layer 63 are separately formed. However, a configuration in which the pixel electrode 52 also serves as the reflective layer may be employed. With such a configuration, it is possible to reduce the film forming process and the patterning process at least once, and thus it is possible to reduce production costs.

This application claims priority from Japanese Patent Application No. 2010-180103 filed in the Japanese patent office on Aug. 11, 2010, the entire disclosure of which is hereby incorporated by reference in its entirely.

What is claimed is:

1. An organic EL device comprising:
a first pixel electrode provided in a first pixel area;
a second pixel electrode provided in a second pixel area;
a third pixel electrode provided in a third pixel area;
a light emitting functional layer provided on the first pixel electrode, the second pixel electrode, and the third pixel electrode;
an electrode provided on the light emitting functional layer;
a first color filter provided in the first pixel area and surrounding the second pixel area;
a second color filter provided in the second pixel area and a first ring-shaped area surrounding the second pixel area; and
a third color filter provided in the third pixel area and a second ring-shaped area surrounding the third pixel area,
wherein the second color filter overlaps the first color filter in the first ring-shaped area.

2. The organic EL device according to claim 1,
wherein the first color filter surrounds the third pixel area, and the third color filter overlaps the first color filter in the second ring-shaped area.

3. The organic EL device according to claim 1,
wherein the first color filter is a red color filter that allows red light to pass, the second color filter is a green color filter that allows green light to pass, and the third color filter is a blue color filter that allows blue light to pass.

4. The organic EL device according to claim 3,
wherein the first color filter is provided between the electrode and the second color filter in the first ring-shaped area.

5. The organic EL device according to claim 1, the organic EL device further comprising a protective layer provided on the electrode,
wherein the first color filter, the second color filter, and the third color filter are provided on the protective layer.

6. The organic EL device according to claim 5, wherein the protective layer includes a planarization layer formed of an organic material formed over the electrode and an inorganic material layer formed on the planarization layer.

7. An organic EL device comprising:
a first pixel electrode provided in a first pixel area;
a second pixel electrode provided in a second pixel area;
a third pixel electrode provided in a third pixel area;
a light emitting functional layer provided on the first pixel electrode, the second pixel electrode, and the third pixel electrode;
an electrode provided on the light emitting functional layer;
a first color filter provided in the first pixel area and surrounding an area including the second pixel area and the third pixel area;
a second color filter provided in the second pixel area and a first ring-shaped area surrounding the second pixel area; and
a third color filter provided in the third pixel area and a second ring-shaped area surrounding the third pixel area,
wherein the second color filter overlaps the first color filter in the first ring-shaped area.

8. The organic EL device according to claim 7,
wherein the third color filter overlaps the first color filter in the second ring-shaped area.

9. The organic EL device according to claim 7,
wherein the third color filter overlaps the second color filter in an area where the second pixel electrode and third pixel electrode are opposed in a plan view.

10. The organic EL device according to claim 7,
wherein the first color filter surrounds the third pixel area, and the third color filter overlaps the first color filter in the second ring-shaped area.

11. The organic EL device according to claim 7,
wherein the first color filter is a red color filter that allows red light to pass, the second color filter is a green color filter that allows green light to pass, and the third color filter is a blue color filter that allows blue light to pass.

12. The organic EL device according to claim 11,
wherein the first color filter is provided between the electrode and the second color filter in the first ring-shaped area.

13. The organic EL device according to claim 7, the organic EL device further comprising a protective layer provided on the electrode,
wherein the first color filter, the second color filter, and the third color filter are provided on the protective layer.

14. The organic EL device according to claim 13,
wherein the protective layer includes an inorganic material layer.

15. The organic EL device according to claim 13, wherein the protective layer includes a planarization layer formed of an organic material formed over the electrode and an inorganic material layer formed on the planarization layer.

16. A method of producing an organic EL device comprising:

forming a first pixel electrode in a first pixel area;
forming a second pixel electrode in a second pixel area;
forming a third pixel electrode in a third pixel area;
forming a light emitting functional layer on the first pixel electrode, the second pixel electrode, and the third pixel electrode;
forming an electrode on the light emitting functional layer;
forming a first color filter in the first pixel area so as to surround an area including the second pixel area and the third pixel area;
forming a second color filter in the second pixel area and a first ring-shaped area surrounding the second pixel area so that the second color filter overlaps the first color filter in the first ring-shaped area; and
forming a third color filter in the third pixel area and a second ring-shaped area surrounding the third pixel area.

17. An electronic apparatus comprising the organic EL device according to claim 1.

18. An electronic apparatus comprising the organic EL device according to claim 2.

19. An electronic apparatus comprising the organic EL device according to claim 3.

20. An electronic apparatus comprising the organic EL device according to claim 7.

* * * * *